(12) United States Patent
Park et al.

(10) Patent No.: US 11,761,591 B2
(45) Date of Patent: Sep. 19, 2023

(54) BULB-TYPE LIGHT SOURCE

(71) Applicant: SEOUL SEMICONDUCTOR CO., LTD., Ansan-si (KR)

(72) Inventors: Jae Hyun Park, Ansan-si (KR); Seong Jin Lee, Ansan-si (KR); Jong Kook Lee, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 18/067,286

(22) Filed: Dec. 16, 2022

(65) Prior Publication Data

US 2023/0120479 A1    Apr. 20, 2023

Related U.S. Application Data

(63) Continuation of application No. 17/385,327, filed on Jul. 26, 2021, now Pat. No. 11,530,783, which is a continuation of application No. 16/822,312, filed on Mar. 18, 2020, now Pat. No. 11,073,249, which is a continuation of application No. PCT/KR2018/013157, filed on Nov. 1, 2018.

(30) Foreign Application Priority Data

Nov. 20, 2017   (KR) .......................... 10-2017-0155075

(51) Int. Cl.
*F21K 9/235*    (2016.01)
*F21K 9/232*    (2016.01)
*F21Y 115/10*   (2016.01)

(52) U.S. Cl.
CPC .............. *F21K 9/235* (2016.08); *F21K 9/232* (2016.08); *F21Y 2115/10* (2016.08)

(58) Field of Classification Search
CPC ....... F21K 9/235; F21K 9/232; F21Y 2115/10
See application file for complete search history.

(56) References Cited

U.S. PATENT DOCUMENTS

2011/0163683 A1    7/2011   Steele et al.
2012/0106153 A1*   5/2012   Huang .................... F21K 9/232
                                                     362/249.02
(Continued)

FOREIGN PATENT DOCUMENTS

CN          202082656 U      12/2011
CN          103542308 A       1/2014
(Continued)

OTHER PUBLICATIONS

English translation of Koji JP-2015038853-A published Feb. 2015 (Year: 2015).*

(Continued)

*Primary Examiner* — Evan P Dzierzynski
(74) *Attorney, Agent, or Firm* — Perkins Coie LLP

(57) ABSTRACT

A lighting device includes a substrate having a plurality of flat portions and a non-flat portion disposed between the flat portions, a plurality of light emitting sources disposed on the substrate, a fluorescent substrate layer covering one or more light emitting sources and converting a wavelength of a light from the light emitting source, and a connection line disposed on the substrate and electrically connecting the light emitting sources adjacent to each other between the adjacent light emitting sources. The substrate has a first end and a second end are arranged at different distance from a central axis.

20 Claims, 27 Drawing Sheets

(56) References Cited

U.S. PATENT DOCUMENTS

| | | |
|---|---|---|
| 2014/0056002 A1 | 2/2014 | Roberts |
| 2014/0268740 A1 | 9/2014 | Veres et al. |
| 2014/0268779 A1 | 9/2014 | Sorensen et al. |
| 2014/0362565 A1 | 12/2014 | Yao et al. |
| 2015/0255440 A1* | 9/2015 | Hsieh ............... H01L 24/81 257/88 |
| 2017/0051878 A1* | 2/2017 | Jiang ................. F21K 9/64 |
| 2017/0108173 A1* | 4/2017 | Kim ................... H01L 33/32 |
| 2017/0108203 A1 | 4/2017 | Habchi |
| 2017/0167663 A1 | 6/2017 | Hsiao et al. |
| 2017/0373118 A1* | 12/2017 | Hugon ............... H01L 33/32 |
| 2018/0135810 A1 | 5/2018 | Lin et al. |
| 2021/0348725 A1 | 11/2021 | Park et al. |

FOREIGN PATENT DOCUMENTS

| | | |
|---|---|---|
| CN | 103791286 A | 5/2014 |
| CN | 104006321 A | 8/2014 |
| CN | 104197281 A | 12/2014 |
| CN | 204005338 U | 12/2014 |
| CN | 205350910 U | 6/2016 |
| CN | 106468405 A | 3/2017 |
| CN | 206112577 U | 4/2017 |
| CN | 106764522 A | 5/2017 |
| CN | 106939973 A | 7/2017 |
| JP | 2015038853 A * | 2/2015 |
| JP | 2015038853 A | 2/2015 |
| WO | 2017153856 A1 | 9/2017 |

OTHER PUBLICATIONS

Office Action issued in corresponding CN Application No. 202011371609.1 dated May 31, 2022, 5 pages.
Office Action issued in corresponding CN Application No. 201880035433.7 dated Jan. 25, 2022, 10 pages.
Office Action issued in Korean Application No. 10-2017-0155075, dated Dec. 14, 2021, 6 pages.
Office Action from related European Patent Application No. 18879471.3 dated Jan. 27, 2023 (8 pages).
Office Action from corresponding Chinese Patent Application No. 202011371609.1 dated Apr. 27, 2023 (3 pages).

* cited by examiner

BULB-TYPE LIGHT SOURCE

CROSS-REFERENCE OF RELATED APPLICATIONS

The present application is a continuation of U.S. patent application Ser. No. 17/385,327, filed on Jul. 26, 2021, which is a continuation of U.S. patent application Ser. No. 16/822,312 filed Mar. 18, 2020, which is a continuation of PCT Application No. PCT/KR2018/013157 filed Nov. 1, 2018, which claims priorities and benefits of Korean Patent Application No. 10-2017-0155075, filed on Nov. 20, 2017. The contents of each application noted above are incorporated by reference in their entireties.

TECHNICAL FIELD

Various embodiments disclosed in the present disclosure relate to a bulb-type light source having a bulb shape, and more particularly, relate to a bulb-type light source including a light emitting device.

BACKGROUND

Conventionally, a light bulb employing a filament as its light source is being used; however, the light bulb is being gradually replaced with a light emitting device, such as a light emitting diode, as the light bulb employing the filament has low light amount and high power consumption. When the light emitting device is used, the light emitting device is made to have the look and shape of a conventional filament for a decorative purpose. For instance, the light emitting device may be designed to have the same shape as a conventional filament bulb.

However, in the case where the light source having the same shape as the conventional filament bulb is manufactured using the light emitting device, a light emitting direction may be limited.

SUMMARY

A lighting device according to various embodiments of the present disclosure includes a substrate having a plurality of flat portions and a non-flat portion disposed between the flat portions, a plurality of light emitting sources disposed on the substrate, a fluorescent substrate layer covering one or more light emitting sources and converting a wavelength of a light from the light emitting source, and a connection line disposed on the substrate and electrically connecting the light emitting sources adjacent to each other between the adjacent light emitting sources. The substrate has a first end and a second end are arranged at different distance from a central axis.

In at least one variation, the lighting device further includes a glove to transmit a light emitted from the light emitting source.

In another variant, the lighting device further includes a socket engaged with the globe and a power board disposed in the socket and connected to the light emitting source.

In further another variant, the first end of the substrate is connected to the power board, and the second end of the substrate is spaced apart from the power board.

In another variant, the plurality of light emitting sources are arranged radially about a center of the glove when viewed from one direction.

In another variant, the first end of the substrate is farther away from the center than the second end of the substrate is.

In another variant, the substrate is farther away from the center at a position between the first and second ends than from the first and second ends.

In another variant, the lighting device further includes a fixing plate that fixes the second end.

In another variant, each light emitting source emits light with an orientation angle in two or more light emission areas, and two light emission areas are positioned at the second ends adjacent to each other and overlap with each other. A distance from the fixing plate to the overlapping area is smaller than a distance from the fixing plate to the globe.

In another variant, an electrode pad is disposed at the first end to supply power to the light emitting sources.

A lighting device according to embodiments of the present disclosure, includes a globe transmitting a light, a substrate comprising a plurality of flat portions and at least one of non-flat portion, a plurality of light emitting sources disposed on the substrate, a fluorescent substrate layer covering one or more light emitting sources and converting a wavelength of a light from the light emitting source, and a connection line disposed on the substrate and electrically connecting the light emitting sources adjacent to each other between the adjacent light emitting sources. The substrate has a first end and a second end, the first end and the second end arranged at different distance from a central axis.

In at least one variant, the lighting device further includes a socket engaged with the globe, and a power board disposed in the socket and connected to the light emitting source.

In another variant, the first end of the substrate is connected to the power board, and the second end of the substrate is spaced apart from the power board.

In further another variant, the plurality of light emitting sources are arranged radially about a center of the glove when viewed from one direction.

In another variant, the first end of the substrate is farther away from the center than the second end of the substrate is.

In another variant, the substrate is farther away from the center at a position between the first and second ends than from the first and second ends.

The lighting device further includes a fixing plate that fixes the second end.

In another variant, each light emitting source emits a light with an orientation angle in two or more light emission areas, and two light emission areas are positioned at the second ends adjacent to each other and overlap with each other. A distance from the fixing plate to the overlapping area is smaller than a distance from the fixing plate to the globe.

In another variant, an electrode pad is disposed at the first end to supply a power to the light emitting sources.

In another variant, the power board is provided with an insertion hole into which the first end is inserted, and the power is supplied to the light emitting device chips through the electrode pad when the first end is inserted into the insertion hole.

Various embodiments disclosed in the present disclosure provide a bulb-type light source having the same shape as a conventional light bulb and having a light emitting device filament having good light uniformity in all directions.

A bulb-type light source according to various embodiments of the present disclosure includes a globe transmitting a light and at least one light emitting device filament disposed in the globe. The light emitting device filament includes a substrate including n (n is a natural number equal to or greater than 2) flat portions and n−1 bendable portions disposed between the flat portions, a plurality of light emitting device chips disposed on the flat portions, a fluorescent substance layer covering the light emitting device chip and converting a wavelength of a light from the light emitting device chip, and a connection line disposed on the flat portions and electrically connecting the light emitting device chips adjacent to each other between the adjacent light emitting device chips.

The substrate includes at least one notch defined in the bendable portions, and at least one light emitting device chip is disposed in each flat portion.

The connection line has different widths from each other at the bendable portion. The connection line has a zigzag shape at the bendable portion.

The fluorescent substance layer is disposed at, at least a portion of the flat portion and covers the light emitting device chips. The fluorescent substance layer extends from the flat portion and covers the bendable portion. The fluorescent substance layer is bent at the bendable portion. The fluorescent substance layer has different thicknesses in the flat portions and the bendable portion.

At least one flat portion among the flat portions has a length different from the other flat portions.

The notch is provided along a width direction of the light emitting device filament. The notch is provided along a longitudinal direction of the light emitting device filament. The notch is provided to be inclined with respect to a longitudinal direction of the light emitting device filament.

The bulb-type light source further includes a socket engaged with the globe and a power board disposed in the socket and connected to the light emitting device filament.

A first end of the light emitting device filament is connected to the power board, and a second end of the light emitting device filament is spaced apart from the power board.

The light emitting device filament is provided in plural, and the light emitting device filaments are arranged radially about a center of the glove when viewed from one direction.

The first end of the light emitting device filament is farther away from the center than the second end of the light emitting device filament is.

The light emitting device filament is farther away from the center at a position between the first and second ends than at the first and second ends.

The bulb-type light source further includes a fixing plate that fixes the second ends.

When each light emitting device chip emits a light with an orientation angle, light emission areas in the orientation angle of the light emitting device chips, which are positioned at the second ends adjacent to each other, overlap each other, and a distance from the fixing plate to the overlapping area is smaller than a distance from the fixing plate to the globe.

An electrode pad is disposed at the first end to supply a power to the light emitting device chips.

The power board is provided with an insertion hole into which the first end is inserted, and the power is supplied to the light emitting device chips through the electrode pad when the first end is inserted into the insertion hole.

Other aspects, advantages, and salient features of the present disclosure will become apparent to those skilled in the art from the following detailed description, which, taken in conjunction with the annexed drawings, discloses various embodiments of the present disclosure.

According to an exemplary embodiment of the present disclosure, the bulb-type light source with the shape similar to that of the conventional bulb but with the high light uniformity in all directions is provided.

DETAILED DESCRIPTION OF EMBODIMENTS

Figure 1:
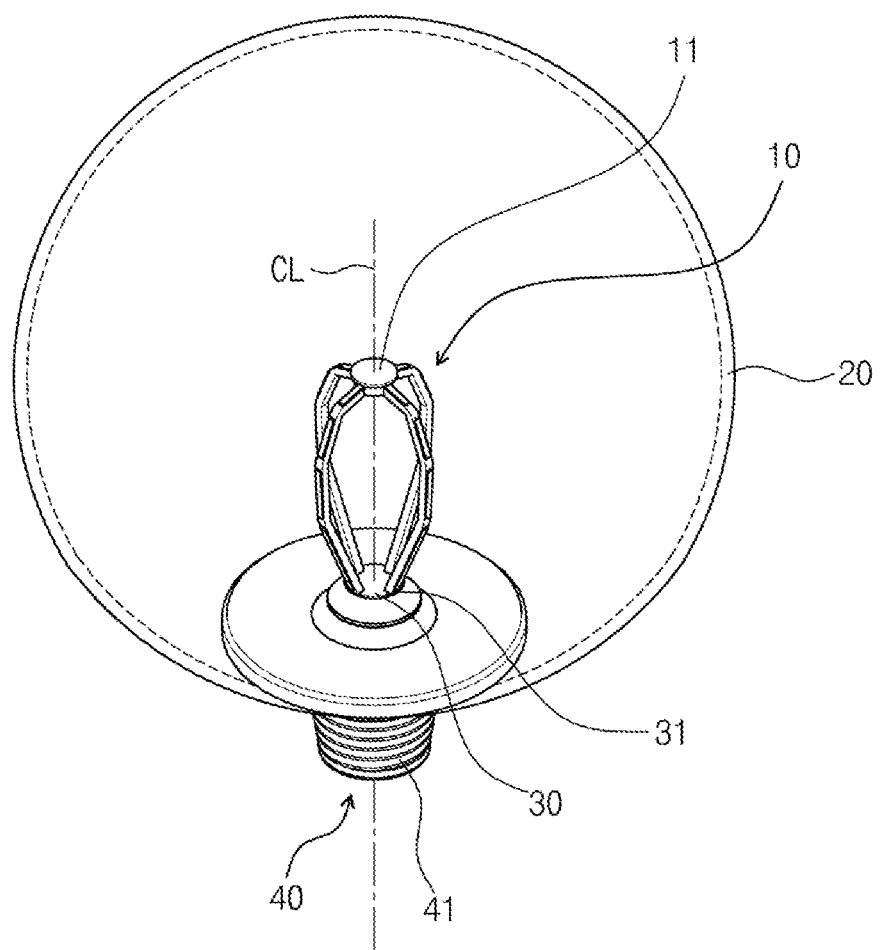
FIG. 1 is a perspective view showing a bulb-type light source according to an exemplary embodiment of the present disclosure.

The present disclosure may be variously modified and realized in many different forms, and thus, specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

Figure 2A:
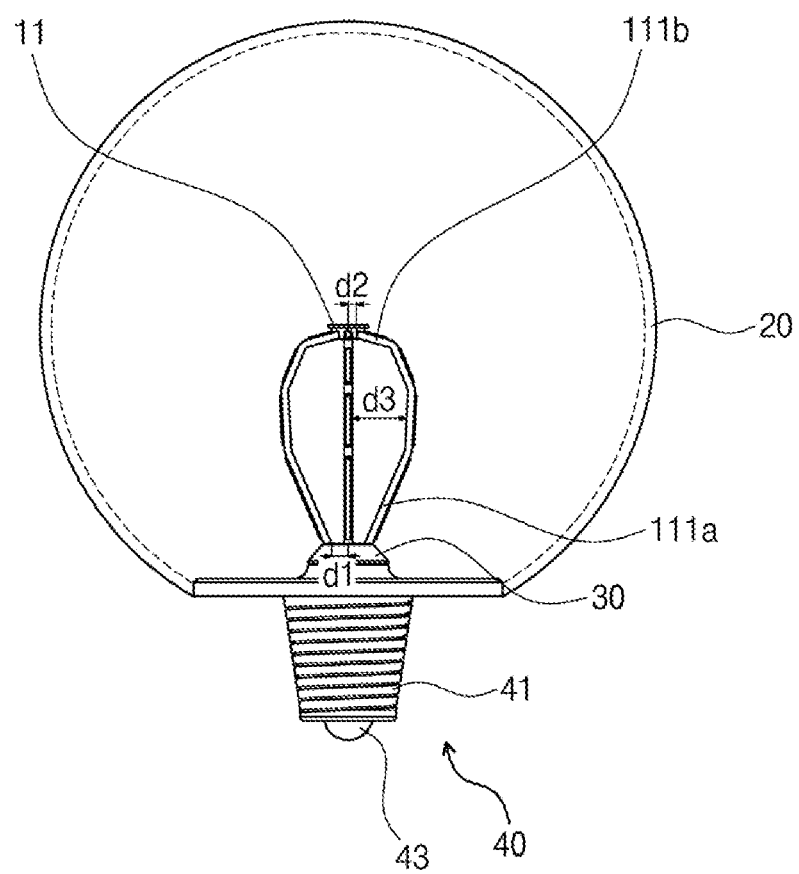
FIG. 2A is a side cross-sectional view showing a bulb-type light source according to an exemplary embodiment of the present disclosure.
Figure 2B:
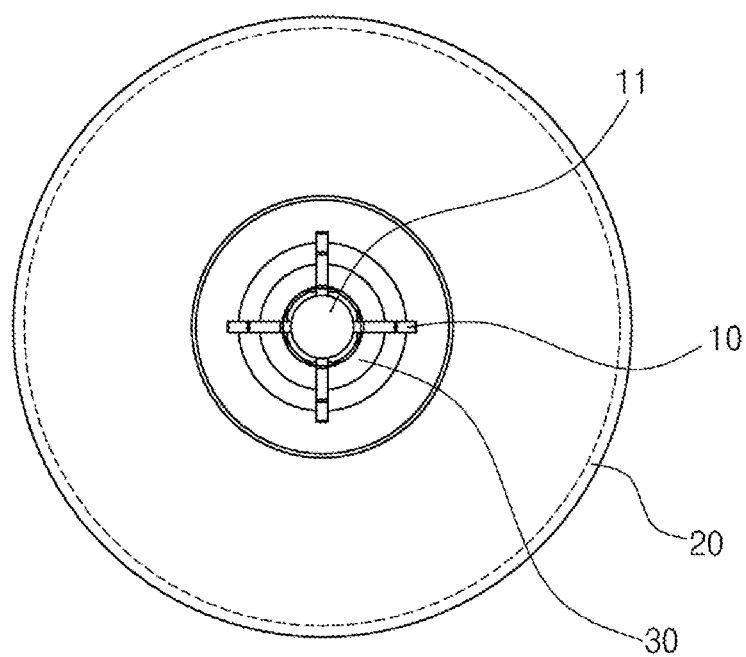
FIG. 2B is a top view showing a bulb-type light source according to an exemplary embodiment of the present disclosure.

Hereinafter, embodiments of the present disclosure will be described in detail with reference to accompanying drawings. FIG. 1 is a perspective view showing a bulb-type light source according to an exemplary embodiment of the present disclosure. FIG. 2A is a side cross-sectional view showing a bulb-type light source according to an exemplary embodiment of the present disclosure. FIG. 2B is a top view showing a bulb-type light source according to an exemplary embodiment of the present disclosure.

Referring to FIGS. 1, 2A, and 2B, the bulb-type light source according to the exemplary embodiment of the present disclosure includes a globe 20 provided with an opening defined through one side thereof and formed of a light transmitting material, a light emitting device filament 10 disposed in the globe 20, a power board 30 connected to one end of the light emitting device filament 10, and a socket 40 connected to the opening of the globe 20 and the power board 30.

The globe 20 has a spherical shape as a whole and has the opening for inserting the light emitting device filament 10, which is defined through one side thereof. The globe 20 may have a complete or incomplete spherical shape except for a portion for the opening, but it should not be limited thereto or thereby. The globe 20 may have a variety of shapes, such as an oval shape, or a shape of which a portion protrudes. The opening may vary depending on the shape of the globe 20 and may have a circular or oval shape.

The globe 20 includes the light transmitting material to transmit a light emitted from the light emitting device filament 10. Here, the phrase, "light transmitting" means that the globe 20 transmits at least a portion of the light emitted from the light emitting device filament 10 in the globe 20, including the situations where the globe 20 is semi-transparent to transmit only a light having a specific wavelength, or only a portion of a light of a specific wavelength, or where the globe 20 is partially transparent. In addition, the phrase, "light transmitting" includes the situation where the globe 20 is transparent to transmit all the light. To this end, the globe 20 may be formed of a transparent or semitransparent glass to transmit at least a portion of the light. However, a material for the globe 20 should not be limited thereto or thereby, and the globe 20 may be formed of a plastic material.

The light emitting device filament 10 is a filament-shaped component and includes a substrate and a light emitting device chip provided on the substrate. The light emitting device filament 10 emits the light. The light emitted from the light emitting device filament 10 transmits through the globe 20 that is transparent and then travels to the outside of the globe 20.

The light emitting device filament 10 is provided in a form that is inserted into the globe 20 through the opening of the globe 20. The light emitting device filament 10 may be provided in an elongated bar shape. One end in a longitudinal direction of the light emitting device filament 10 is referred to as a "first end" 111a and the other end opposite to the first end 111a in the longitudinal direction is referred to as a "second end" 111b, as shown in FIG. 2A.

One or more light emitting device filaments 10 may be provided, for example, about two to about five. In the exemplary embodiment of the present disclosure, four light emitting device filaments 10 are provided. However, a number of the light emitting device filaments 10 should not be limited thereto or thereby, and the light emitting device filaments 10 may be provided in a greater number than the above-mentioned number depending on a size or brightness of the bulb-type light source.

Assuming that an imaginary line extending in a direction in which the socket 40 is engaged with the globe 20 is referred to as a "central axis" CL, the light emitting device filament 10 is engaged with the socket 40 and the power board 30 in the form of extending along the central axis CL. The light emitting device filament 10 may be bent multiple times and may have a bent shape such that a portion thereof is away from the central axis CL. That is, as shown in figures, the first end 111a and the second end 111b are arranged at a relatively small distance from the central axis CL. However, an area between the first end 111a and the second end 111b is arranged at a relatively large distance from the central axis CL. In addition, distances between the central axis CL and the light emitting device filament 10 at the first end 111a and the second end 111b may also be different from each other, and the distance between the central axis CL and the light emitting device filament 10 at the first end 111a may be greater than the distance between the central axis CL and the light emitting device filament 10 at the second end 111b.

A distance between the central axis CL and the light emitting device filament 10 closest to the central axis CL at the first end 111a in a vertical direction of the central axis CL is referred to as a first distance d1, a distance between the central axis CL and the light emitting device filament 10 closest to the central axis CL at the second end 111b in the vertical direction of the central axis CL is a second distance d2, and a distance between the central axis CL and the light emitting device filament 10 in the vertical direction of the central axis CL in the area between the first and second ends 111a and 111b is a third distance d3. The third distance d3 may be greater than the first distance d1 and/or the second distance d2. In addition, the first distance d1 may be greater than the second distance d2. In the exemplary embodiment, the light emitting device filament 10 is farthest away from the central axis CL in the area between the first end 111a and the second end 111b, so that an influence of heat between light emitting device filaments 10 adjacent to each other is minimized. In particular, as a diameter of the globe 20 is the largest in an area corresponding to the area between the first end 111a and the second end 111b, even though the heat is dissipated from the light emitting device filament 10, not only the influence on the adjacent light emitting device filament 10 becomes small but also a heat dissipation toward the globe 20 disposed at an outer side of the light emitting device filament 10 is easy. Further, when the diameter of the globe 20 is larger than other areas, an amount of heat accumulated in a unit space area may be reduced. Accordingly, a heat dissipation effect is maximized by arranging the light emitting device filament 10 to be the farthest away from the central axis CL in the area between the first end 111a and the second end 111b where the diameter of the globe 20 is the largest.

In the exemplary embodiment of the present disclosure, as the third distance d3 is greater than the first distance d1 and/or the second distance d2, the transfer of heat adjacent to the light emitting device filament 10 may be minimized. In addition, since the first distance d1 is greater than the second distance d2, heat generated by the light emitting device filament 10 may be easily distributed or dissipated through the power board 30 (or a separate heat dissipation board provided under the power board 30).

In the exemplary embodiment of the present disclosure, when the light emitting device filament 10 is provided in plural, the light emitting device filaments 10 may be arranged radially with respect to the central axis when viewed from the top perpendicular to the central axis CL. In addition, angles between the radially disposed light emitting device filaments 10 may be substantially equal to each other. Therefore, the light emitted from the light emitting device filament 10 may travel as uniformly as possible in all directions of 360 degrees with respect to the central axis CL. However, according to another exemplary embodiment of the present disclosure, in a case where an emission direction is required to be anisotropic, it is not necessary to arrange the light emitting device filaments 10 radially at equal intervals, and the light emitting device filaments 10 may be further arranged along a particular direction in which the light is directed.

The power board 30 is connected to the first end 111a of the light emitting device filament 10, and the power board 30 supplies a power to the light emitting device filament 10. The second end 111b of the light emitting device filament 10 is spaced apart from the power board 30.

The power board 30 is disposed at the opening of the globe 20 and encapsulates the opening of the globe 20 together with the socket 40. The power board 30 may have a variety of shapes and may fix the light emitting device filament 10 while supplying the power to the light emitting device filament 10. In the exemplary embodiment of the present disclosure, the power board 30 may have a circular plate shape having a step difference. However, the shape of the power board 30 may vary depending on the shape and structure of the globe 20 and the socket 40 and the connection structure to the light emitting device filament 10.

An insertion hole 31 may be defined in the power board 30, and the first end 111a of the light emitting device filament 10 may be inserted into and fixed to the insertion hole 31. The insertion hole 31 may be provided in a number corresponding to the number of the light emitting device filaments 10. A wire connection portion may be disposed inside the insertion hole 31 of the power board 30 to be electrically connected to an electrode pad disposed at the first end 111a of the light emitting device filament 10, and the wire connection portion is electrically connected to the electrode pad disposed at the first end 111a of the light emitting device filament after the light emitting device filament 10 is inserted.

Although not shown in the figures such as FIGS. 1 and 2A-2B, the power board 30 may further include a heat sink for the dissipation in a position adjacent to the electrode pad. The kind or shape of the heat sink should not be particularly limited and may have various known kinds or shapes.

A fixing plate 11 may be provided at the second end 111b of the light emitting device filament 10. The fixing plate 11 may be provided to allow the central axis CL to pass through a center portion thereof. When there are plural light emitting device filaments 10, the fixing plate 11 may serve to collect and fix the second ends 111b of the light emitting device filaments 10. For example, the fixing plate 11 may have grooves in which the second ends 111b are mounted, respectively, and the second ends 111b may be stably supported with each other by being fitted in the grooves. Thus, although external impacts are applied to the bulb-type light source, a structure that is designed to be free of dark spots may be maintained as a gap between the second ends 111b is not excessively widened or narrowed. When the light emitting device filaments 10 are not sufficiently stably fixed, one end of the elongated light emitting device filament 10 may be shaken when being applied with the external impact, and the light emitting device filament 10 may collide with another light emitting device filament adjacent thereto to apply a secondary shock, thereby causing a defect, but the fixing plate 11 prevents the defect. However, when the light emitting device filament 10 is sufficiently firmly fixed and there is not much shaking due to the external impact, the fixing plate 11 may be omitted.

The socket 40 is engaged with the power board 30 and provided with an engaging member to be mounted on an external device (e.g., an electrical outlet). The socket 40 may include a screw thread contact 41 engaged with the opening of the glove 20 and an electrical foot contact 43 protruded downward. The screw thread contact 41 and the electrical foot contact 43 may include a conductive material, but it may be insulated from each other. In this case, the screw thread contact 41 and the electrical foot contact 43 are connected to the electrode pad of the light emitting device filament 10, and the power is applied to the light emitting device filament 10 via the screw thread contact 41 and the electrical foot contact 43. However, the screw thread contact 41 and the electrical foot contact 43 are not necessarily formed of the conductive material in the case where the screw thread contact 41 and the electrical foot contact 43 are made to resemble an old bulb merely for aesthetic appearance. In this case, a power supply formed of a conductive material, such as a connector, may be provided separately in addition to the screw thread contact and the electrical foot contact.

Figure 3A:
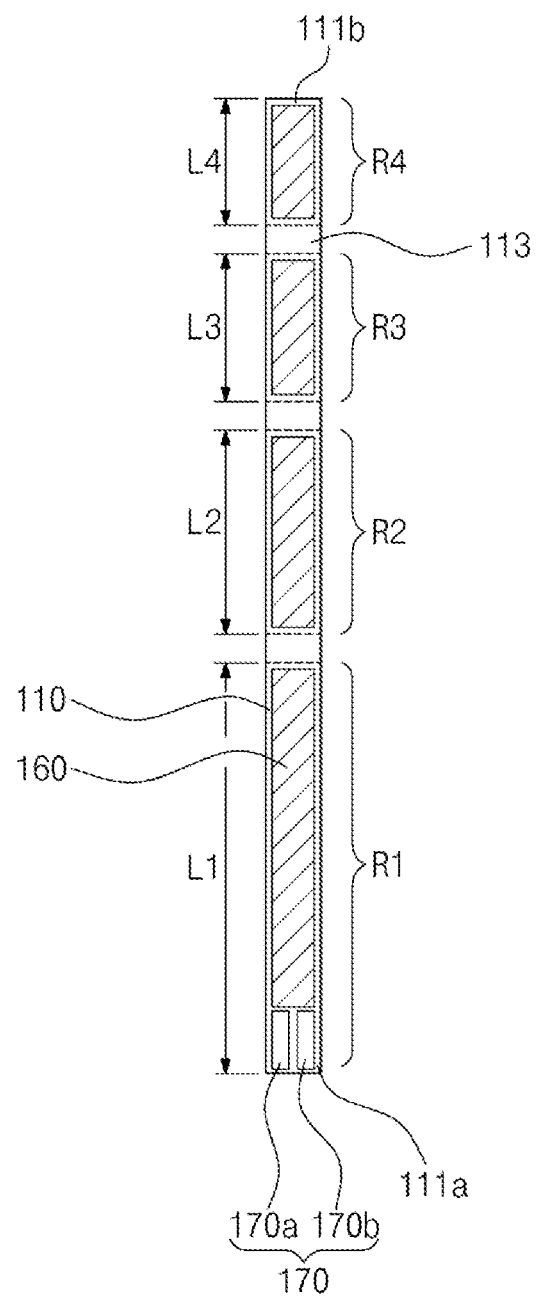
FIG. 3A is a plan view showing a light emitting device filament according to an exemplary embodiment of the present disclosure.
Figure 3B:
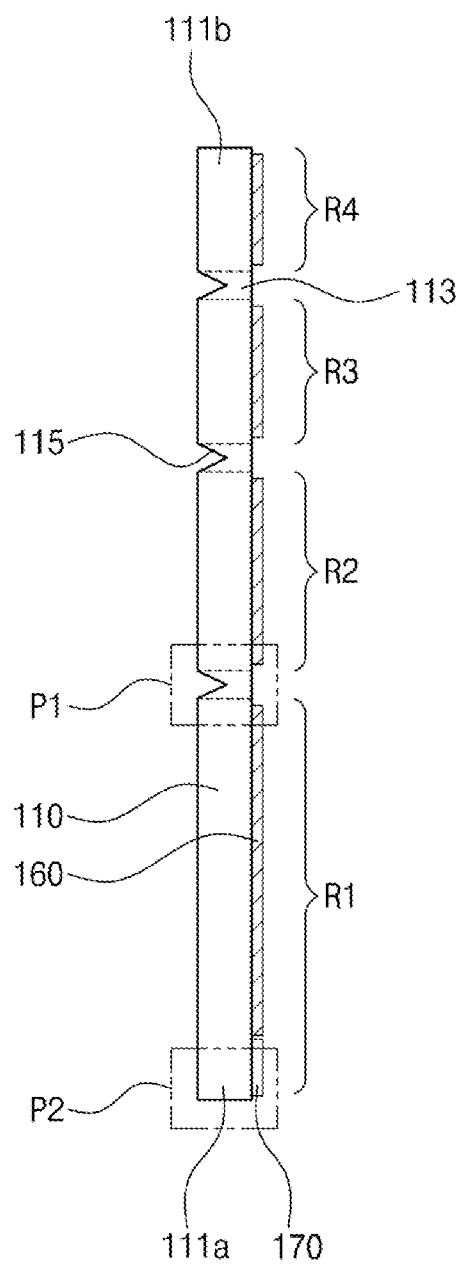
FIG. 3B is a side view showing the light emitting device filament of FIG. 3A.
Figure 3C:
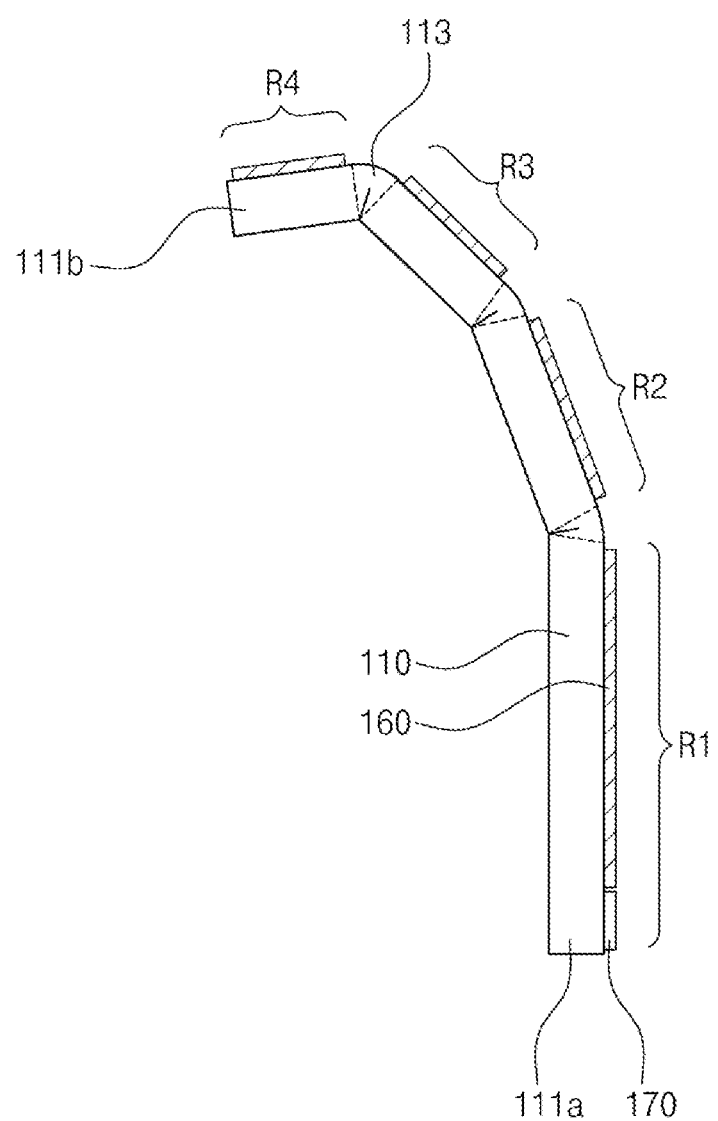
FIG. 3C is a side view showing the light emitting device filament of FIG. 3B having a bendable portion in a bent shape.

FIGS. 3A to 3C are views showing a light emitting device filament according to an exemplary embodiment of the present disclosure. FIG. 3A is a plan view showing the light emitting device filament, and FIGS. 3B and 3C are side views showing the light emitting device filament.

Figure 4A:
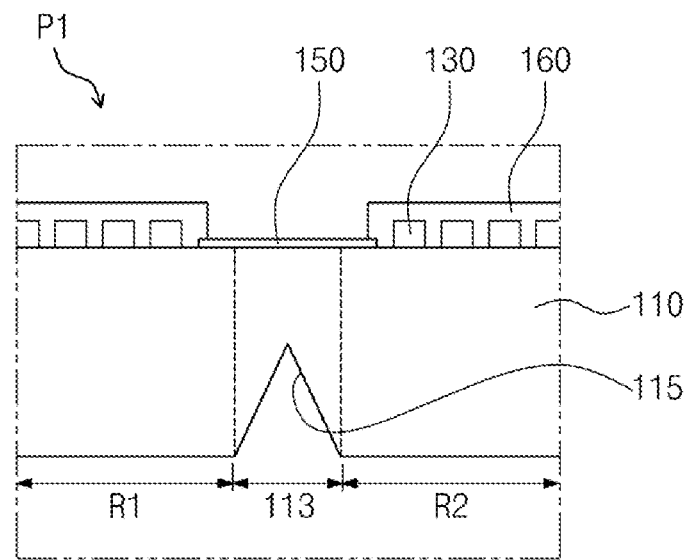
FIG. 4A is an enlarged side cross-sectional view showing a portion P1 of FIG. 3B.
Figure 4B:
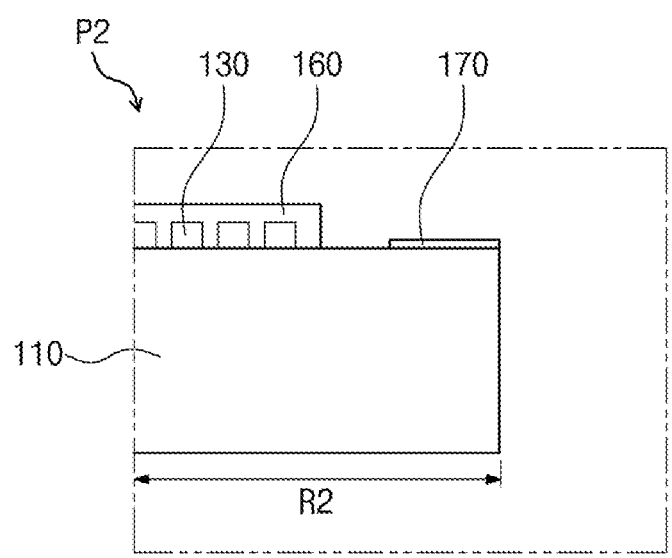
FIG. 4B is an enlarged side cross-sectional view showing a portion P2 of FIG. 3B.
Figure 4C:
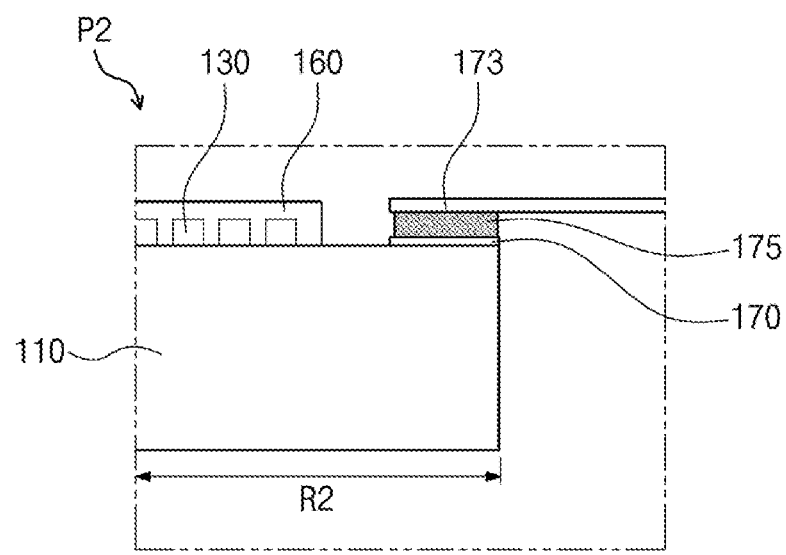
FIG. 4C is an enlarged side cross-sectional view showing a portion P2 of FIG. 3B with an additional line.

FIG. 4A is an enlarged side cross-sectional view showing a portion P1 of FIG. 3B, and FIGS. 4B and 4C are enlarged side cross-sectional views showing a portion P2 of FIG. 3B.

For the convenience of explanation, FIGS. 3A and 3B show a state before the light emitting device filament is bent, and FIG. 3C shows a state after the light emitting device filament is bent.

Referring to FIGS. 3A to 3C and 4A to 4C, the light emitting device filament according to the exemplary embodiment of the present disclosure is elongated in one direction and has the bar shape with a first end 111a and a second end 111b.

The light emitting device filament 10 includes the substrate 110 and the light emitting device chip 130 (FIGS. 4A through 4C) disposed on the substrate 110. The substrate 110 has a bar shape elongated in one direction and is bent at least one time. The substrate 110 includes a conductive material, for example, a single metal of Al, Zn, Ag, W, Ti, Ni, Au, Mo, Pt, Pd, Cu, Cr or Fe, or an alloy thereof. In the exemplary embodiment of the present disclosure, the substrate 110 may include aluminum.

The substrate 110 includes a bendable portion 113 defined by bending a portion thereof and at least two flat portions R1, R2, R3, . . . , and Rn adjacent to each other with the bendable portion 113 disposed therebetween. Since the bendable portion 113 is disposed between the flat portions R1, R2, R3, . . . , and Rn adjacent to each other, the number of the flat portions R1, R2, R3, . . . , and Rn is one more than the number of the bendable portions 113. In other words, when the number of the flat portions R1, R2, R3, R4, . . . , Rn is "n" (n is a natural number of two or more), the number of the bendable portions 113 is "n−1".

A notch 115 having a shape recessed in a direction opposite to at least one surface of the substrate 110 is formed in the bendable portion 113. In the present exemplary embodiment, the notch 115 may have a shape recessed along a width direction of the substrate 110 and may have a triangular shape in a cross-section.

Two or more bendable portions 113, are provided in the substrate 110. Although not shown in figures, when there are components, such as a film, formed on the bendable portion 113, not only the substrate 110 of the bendable portion 113 but also other components on the bendable portion 113 have the bent shape.

In the exemplary embodiment of the present disclosure, the flat portions R1, R2, R3, . . . , Rn correspond to substantially a flat straight area. In the exemplary embodiment of the present disclosure, the flat portions R1, R2, R3, R4, . . . , and Rn may not be provided in a straight-line shape, and at least some of the flat portions R1, R2, R3, R4, . . . , and Rn may be bent as needed. In this case, however, the substrate 110 may not be completely flexible and may include a relatively rigid material to have a flat shape.

As shown in FIG. 3B, the notch 115 is provided to allow the substrate 110 to be easily bent. In the present exemplary embodiment, the notch 115 may have a shape recessed along the width direction of the substrate 110.

A thickness of the substrate 110 in the area where the notch 115 is formed is smaller than a thickness of the substrate 110 in the area where the notch 115 is not formed. Accordingly, the substrate 110 may be easily bent in the area where the notch 115 is formed.

The substrate 110 is configured to be more readily bendable toward the surfaces having the notch 115 formed therein according to the position and the shape of the notch 115. This is because space formed from the notches 115 can be used to allow bending of the substrate 110. Due to the notches 115, the substrate 110 may not be configured to bend in the opposite direction, i.e., toward the surface that the notches 115 are not formed, as the substrate 110 is pulled away relative to the notches 115 for bending. In the exemplary embodiment of the present disclosure, the notch 115 may be defined in a lower surface of the substrate 110, and the substrate 110 may be bent toward the lower surface thereof such that a portion of the lower surface becomes closer to another portion of the lower surface in a direction facing each other.

The flat portions R1, R2, R3, R4, . . . , and Rn may have a relatively flat shape compared with the bendable portion 113. The number of the flat portions R1, R2, R3, R4, . . . , and Rn and the number of the notches 115 may be provided in one or more depending on the shape of the substrate 110 to be finally formed. In the present exemplary embodiment, four flat portions R1, R2, R3, R4, . . . , and Rn, i.e., n=4, and three bendable portions 113 are shown. However, as described above, the number of the flat portions R1, R2, R3, R4, . . . , and Rn and the number of the bendable portions 113 should not be limited thereto or thereby and may be provided in various numbers. In the following drawings, a substrate including first, second, third, and fourth flat portions will be described as a representative example.

The flat portions R1, R2, R3, R4, . . . , and Rn may be sequentially arranged from the first end 111a. The flat portions R1, R2, R3, R4, . . . , and Rn may have the same length as each other or may have different lengths from each other. That is, the length of at least one flat portion among the flat portions R1, R2, R3, R4, . . . , and Rn may have a value different from those of the other flat portions among the flat portions R1, R2, R3, R4, . . . , Rn. The length of each of the flat portions R1, R2, R3, R4, . . . , and Rn may vary depending on a final desired shape of the light emitting device filament 10, i.e., how much bending of the light emitting device filament is desired. For example, in the exemplary embodiment of the present disclosure, when the lengths of the flat portions R1, R2, R3, R4, . . . , Rn are respectively referred to as lengths L1, L2, L3, L4, . . . , and Ln, the lengths L1, L2, L3, L4, . . . , and Ln may have values that sequentially decreases.

According to the lengths of the flat portions R1, R2, R3, R4, . . . , and Rn, the bent shape is changed, and an overall shape of the substrate 110 is changed. When the number of the bendable portions 113 provided in a predetermined area increases, the bending of the substrate 110 increases, and thus, a shape of the light emitting device filament 10 eventually becomes similar to a shape that has a small radius of curvature as a whole, though it is not a curved line. On the contrary, when the number of the bendable portions 113 provided in a predetermined area decreases, the shape of the substrate 110 becomes similar to a straight line and the light emitting device filament 10 has a large radius of curvature as a whole. Therefore, the shape of the light emitting device filament 10 may be changed as a whole by adjusting the number of the bendable portions 113 and the lengths L1, L2, L3, L4, . . . , and Ln of the flat portions R1, R2, R3, . . . , Rn.

In the exemplary embodiment of the present disclosure, the notches 115 between the flat portions R1, R2, R3, R4, . . . , and Rn are shown to have the same size, but they should not be limited thereto or thereby. According to another exemplary embodiment of the present disclosure, each notch 115 may be provided in a different size according to an angle between two flat portions R1, R2, R3, R4, . . . , and Rn to be bent. For example, the recessed degree of one notch 115 from the lower surface of the substrate 110 and the width of the notch 115 may be smaller or larger than the other notches 115.

According to the exemplary embodiment of the present disclosure, the shape and/or the bending angle of the light emitting device filament 10 may be controlled by adjusting the length of each of the flat portions R1, R2, R3, R4, . . . , and Rn, the number of the notches 115, and the size of the notch 115. The shape and/or the bending angle of the light emitting device filament 10 may be determined in consideration of the light emission direction and design factors, and the light emitting device filament 10 may be provided in a form corresponding to the shape of the globe 20.

In the exemplary embodiment of the present disclosure, referring to a first flat portion R1 closest to the first end 111a and an n-th flat portion Rn (corresponding to a fourth flat portion R4 in the drawing) closest to the second end 111b, an angle formed between a longitudinal direction of the first flat portion R1 and a longitudinal direction of the n-th flat portion Rn may be about 45 degrees to about 90 degrees.

The light emitting device chip 130 and a fluorescent substance layer 160 covering the light emitting device chip 130 are provided on at least a portion of the flat portions R1, R2, R3, R4, . . . , and Rn. In this case, the light emitting device chip 130 is not provided in the bendable portion 113.

A connection line 150 is disposed on the flat portions R1, R2, R3, R4, . . . , and Rn and the bendable portion 113 to electrically connect the light emitting device chips 130 in the flat portions R1, R2, R3, R4, . . . , and Rn. The connection line 150 is for applying the power to the light emitting device chips 130. The connection line 150 may be formed on the substrate 110 in various forms. The connection line 150 may be formed in a variety of different ways that allow the electrical connection, for example, in the form of a plating film, in the form of a wire, a solder paste, a connector, and the like.

The light emitting device chip 130 is disposed on at least some of the flat portions R1, R2, R3, R4, . . . , and Rn of the substrate 110 and emits a light. The light emitted from the light emitting device chip 130 may be an infrared light, an ultraviolet light, or a visible light, but it should not be particularly limited. In the exemplary embodiment of the present disclosure, the light emitting device chip 130 may emit the visible light.

The light emitting device chip 130 is disposed on at least two flat portions R1, R2, R3, R4, . . . , and Rn on the substrate 110. One or more light emitting device chips 130 may be provided for each of the flat portions R1, R2, R3, R4, . . . , and Rn and may be provided in different numbers for each of the flat portions R1, R2, R3, R4, . . . , and Rn. The light emitting device chips 130 may be provided separately from each other and may be arranged in various forms on each flat portion of the substrate 110. For example, the light emitting device chips 130 may be arranged in a line form, or a matrix form on the substrate 110 along a longitudinal direction of the substrate 110. However, the arrangement of the light emitting device chips 130 should not be limited thereto or thereby and may be randomly arranged.

Each light emitting device chip 130 may emit lights having various colors. Each light emitting device chip 130 may include a variety of elements that emits the light, and a light emitting diode according to an exemplary embodiment of the present disclosure may be used.

Each light emitting device chip 130 may emit a white light and/or a color light. Each light emitting device chip 130 may emit one color; however, each light emitting device chip 130 may emit the white light and/or the color light by combining different colors. In the exemplary embodiment of the present disclosure, the light emitting device chip 130 may include a red light emitting device chip, a green light emitting device chip, and a blue light emitting device chip. However, the color emitted by the light emitting device chips 130 should not be limited thereto or thereby, and each light emitting device chip 130 may emit colors such as cyan, magenta, and yellow.

It is not necessary for each light emitting device chip 130 to use green, red, and/or blue light emitting device chips in order to implement the color, and a light emitting device chip 130 emitting a color other than the red, green, and blue light emitting device chips may be used. The fluorescent substance layer 160 is disposed on the light emitting device chip 130, covers the light emitting device chip 130, and converts a wavelength of the light emitted from the light emitting device chip 130.

For example, a red light emitting diode may be used to implement the red color; however, the red light may be emitted by using a blue or ultraviolet light emitting diode with the fluorescent substance layer 160 that absorbs a blue light or ultraviolet light and then emits the red color. In the same manner, a green light emitting diode may be used to implement the green color; however, the green light may be emitted by using the blue or ultraviolet light emitting diode with the fluorescent substance layer 160 that absorbs the blue light or ultraviolet light and then emits the green color.

The fluorescent substance layer 160 may be disposed on the substrate 110 and may cover at least one light emitting device chip 130. In other words, the fluorescent substance layer 160 may be provided to cover each light emitting device chip 130, or may be provided to cover two or more light emitting device chips 130. In the exemplary embodiment of the present disclosure, the fluorescent substance layer 160 is provided to cover the light emitting device chips 130 disposed on each flat portions R1, R2, R3, . . . , and Rn; however, the present disclosure should not be limited thereto or thereby. Two fluorescent substance layers 160 spaced apart from each other may be disposed on each one of the flat portions R1, R2, R3, . . . , and Rn. In this case, however, the light emitting chips 130 may be covered by the fluorescent substance layer 160 from the top of the light emitting chips 130. According to the exemplary embodiment of the present disclosure, if necessary, the fluorescent substance layer 160 may not be disposed on the light emitting device chip 130. When the fluorescent substance layer 160 is not provided on the light emitting device chip 130, a separate structure for protecting the light emitting device chip 130 may be added; however, it should not be limited thereto or thereby.

The fluorescent substance layer 160 may not be greatly restricted in shape as long as the fluorescent substance layer 160 covers the light emitting device chip 130 and converts the color of the emitted light; however, the fluorescent substance layer 160 may be provided only on an upper surface of the substrate 110 in the exemplary embodiment of the present disclosure. When the fluorescent substance layer 160 is provided on the upper surface of the substrate 110, in particular, only on a portion of the upper surface of the substrate 110, a lower surface and a side surface of the substrate 110 and/or a portion of the upper surface of the substrate 110 are exposed to the outside, and thus, the dissipation of heat through the substrate 110 may be easily performed. Accordingly, the heat generated by the light emitting device chip 130 may be effectively removed, and thus, a defective rate of the light emitting device chip 130 may be reduced.

In the above-described embodiments, for the convenience of explanation, only the light emitting device chip 130, the connection line 150, and the fluorescent substance layer 160 are shown on the substrate 110, however, other additional components may be further provided. For example, an insulating adhesive layer may be further provided between the substrate 110 and the light emitting device chip 130 to attach the light emitting device chip 130 to the substrate 110. The connection line 150 may be disposed on the insulating adhesive layer, and a photo solder resist (PSR) may be further disposed between the connection line 53 and the fluorescent substance layer 160.

Figure 5:
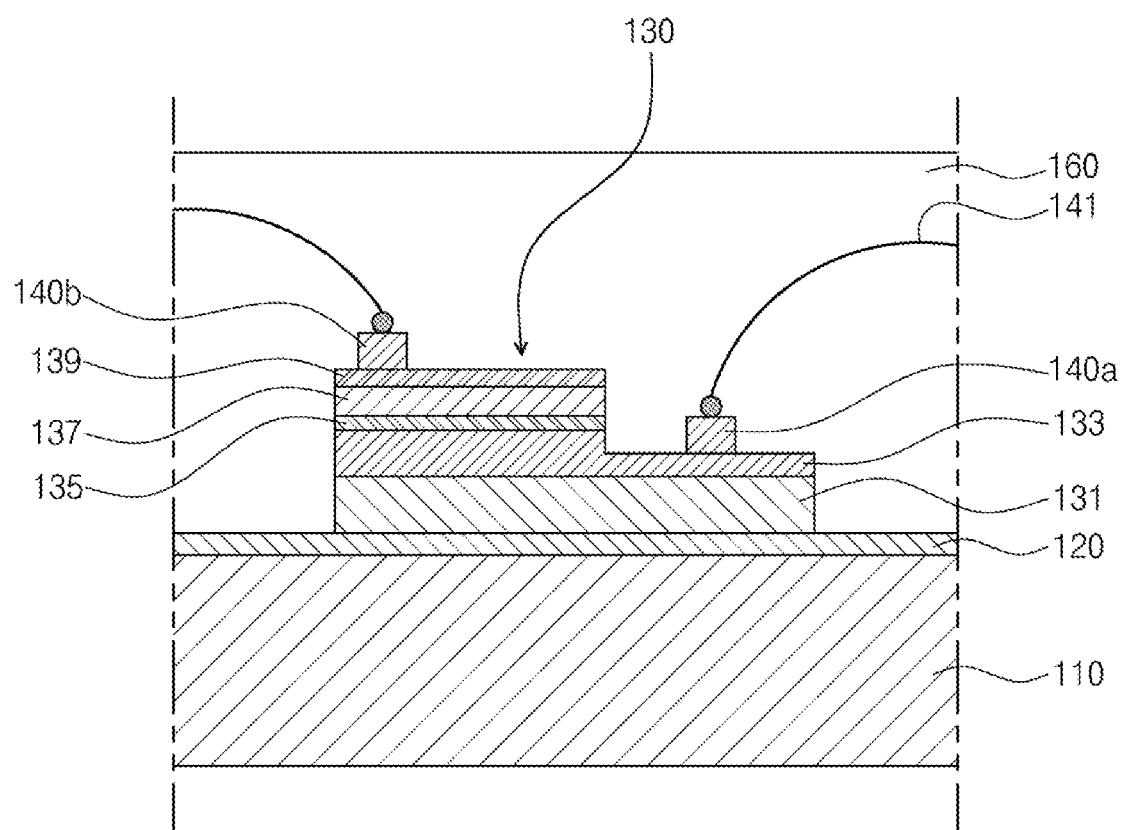
FIG. 5 is a cross-sectional view showing a light emitting device chip implemented using a light emitting diode according to an exemplary embodiment of the present disclosure.

The light emitting device chip 130 according to the exemplary embodiment of the present disclosure may be implemented in various ways, and FIG. 5 is a cross-sectional view showing the light emitting device chip 130 implemented as a light emitting diode according to an exemplary embodiment of the present disclosure. The light emitting diode may be configured in various forms such as a vertical type or a flip type. In the present exemplary embodiment, the vertical-type light emitting diode is shown as a representative example. However, the structure of the light emitting diode should not be limited thereto or thereby, and the following drawings should be understood as one embodiment of the present disclosure.

Referring to FIG. 5, the light emitting device chip 130 is provided on the substrate 110 with the insulating adhesive layer 120 interposed therebetween.

The light emitting device chip 130 may include a device substrate 131, a first conductive type semiconductor layer 133, an active layer 135, a second conductive type semiconductor layer 139, and first and second contact electrodes 140a and 140b.

The device substrate 131 is a growth substrate 110 to grow a III-V nitride-based semiconductor layer, and may be, for example, a sapphire substrate, particularly a patterned sapphire substrate. The device substrate 131 is preferably an insulating substrate; however, it should not be limited to the insulating substrate.

The first conductive type semiconductor layer 133, the active layer 135, and the second conductive type semiconductor layer 139 are sequentially disposed on the device substrate 131. The first conductive type and the second conductive type have opposite polarities to each other. When the first conductivity type is an n-type, the second conductive type is a p-type, or alternatively, when the first conductive type is the p-type, the second conductive type is the n-type. In the exemplary embodiment of the present disclosure, a structure in which the n-type semiconductor layer, the active layer, and the p-type semiconductor layer are sequentially formed on the device substrate 131 will be described as a representative example.

The n-type semiconductor layer, the active layer, and the p-type semiconductor layer may be formed of a III-V nitride-based semiconductor, for example, a nitride-based semiconductor such as (Al, Ga, In)N. The n-type semiconductor layer, the active layer, and the p-type semiconductor layer may be formed by being grown on the substrate 110 in a chamber using a known method such as a metal-organic chemical vapor deposition (MOCVD). In addition, the n-type semiconductor layer includes n-type impurities (e.g., Si, Ge, or Sn), and the p-type semiconductor layer includes p-type impurities (e.g., Mg, Sr, or Ba). For example, the n-type semiconductor layer may include GaN or AlGaN containing Si as a dopant, and the p-type semiconductor layer may include GaN or AlGaN containing Mg as a dopant. Although the n-type semiconductor layer and the p-type semiconductor layer are each shown as having a single-layer structure in the drawings, these layers may have a multi-layer structure and may also include a superlattice layer. The active layer may have a single quantum well structure or a multi-quantum well structure, and a composition ratio of the nitride-based semiconductor is adjusted to emit a desired wavelength. For example, the active layer may emit a blue light, or an ultraviolet light.

The first contact electrode 140a is disposed on the first conductive type semiconductor layer 133 on which the active layer 135 and the second conductive type semiconductor layer 139 are not provided, and the second contact electrode 140b is disposed on the second conductive type semiconductor layer 139.

The first and/or second contact electrodes 140a and 140b may have a single-layer, or multi-layer structure of metals. As the material of the first and/or second contact electrodes 140a and 140b, metals such as Al, Ti, Cr, Ni, Au, and alloys thereof may be used.

In the exemplary embodiment of the present disclosure, although the light emitting device chip 130 is briefly described with reference to the drawings, the light emitting device chip 130 may further include a layer having additional functions in addition to the above-described layer. For example, an electron blocking layer 137 may be disposed on the active layer 135. The electron blocking layer is disposed between the active layer 135 and the second conductive type semiconductor layer 139 and prevents electrons that are not combined with holes in the active layer due to a relatively high energy band gap from being diffused to the second conductive type semiconductor layer 139 disposed thereon. The electron blocking layer 137 may include, for example, aluminum gallium nitride (AlGaN). Further, the light emitting device chip 130 may include various layers, such as a reflective layer for reflecting a light, an additional insulating layer for insulating a specific component, and a solder-preventing layer for preventing the solder from being diffused.

When a forward bias is applied to the light emitting diode having the above-mentioned structure, the electrons are combined with the holes in the active layer 135, and the light is emitted.

Referring to FIGS. 3A to 3C and 4A to 4C again, the first contact electrode and the second contact electrode are connected to the connection line 150 through wires. A first power and a second power are applied to the connection line 150. When the first power and the second power are applied to the first contact electrode and the second contact electrode through the wires, the light emitting device chip 130 is driven to emit a light.

In the exemplary embodiment of the present disclosure, an electrode pad 170 connected to the connection line 150 is disposed at the first end 111a (see FIGS. 3A through 3C). The electrode pad 170 includes a first electrode pad 170a and a second electrode pad 170b, which are respectively connected to the first contact electrode and the second contact electrode of the light emitting device chip 130. The first and second electrode pads 170a and 170b are disposed at the first end 111a of the substrate 110. The first and second electrode pads 170a and 170b are disposed to be spaced apart from each other, and upper surfaces of the first and second electrode pads 170a and 170b are exposed to the outside.

In the exemplary embodiment of the present disclosure, the first and second electrode pads 170a and 170b disposed at the first end 111a may be engaged with the power board 30 in various forms to be electrically connected to the power board 30.

For example, as shown in FIG. 4B, the upper surface of the electrode pad 170 is exposed to the outside, the exposed upper surface makes contact directly with the wire connection portion provided in the insertion hole of the power board 30 when being inserted in the insertion hole, and thus, the power may be applied to the electrode pads 170.

In the exemplary embodiment of the present disclosure, the electrode pad 170 may be provided in other forms. For example, it may be directly attached to the exposed first and second electrode pads using a conductive adhesive member (e.g., an anisotropic adhesive, a solder, etc.).

As shown in FIG. 4C, an additional line 173 may be attached directly to the second electrode pad 170. Referring to FIG. 4C, a conductive adhesive member 175 may be disposed on the second electrode pad 170, and the additional line 173 may be connected to the electrode pad 170 with the conductive adhesive member 175 interposed therebetween. The additional line 173 may have various shapes, such as a wire form or a plate shape. According to the present exemplary embodiment, the electrical connection with other components may be facilitated through the additional line 173.

Figure 6A:
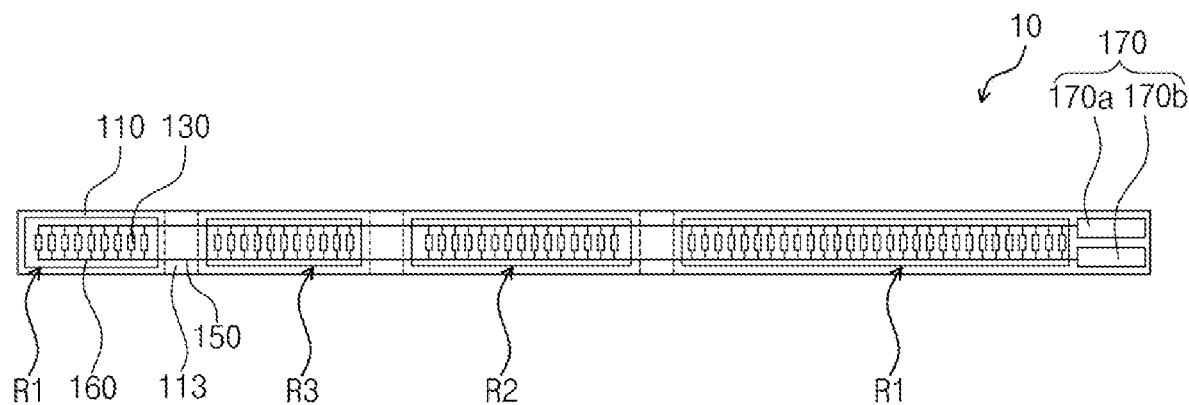
FIG. 6A is a conceptual view showing a plurality of light emitting devices connected to a connection line in parallel according to an exemplary embodiment of the present disclosure.
Figure 6B:
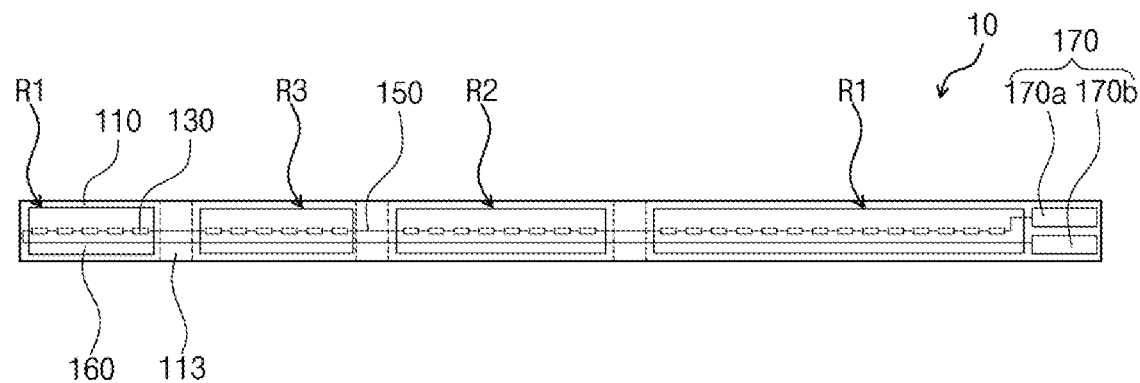
FIG. 6B is a conceptual view showing a plurality of light emitting devices connected to a connection line in series according to an exemplary embodiment of the present disclosure.

In the exemplary embodiment of the present disclosure, the light emitting device chips may be connected to the connection line in various forms. FIGS. 6A and 6B are conceptual views showing the light emitting device chips connected to the connection line according to an exemplary embodiment of the present disclosure.

Referring to FIG. 6A, a plurality of light emitting device chips 130 may be connected to a connection line 150 in parallel. According to the present exemplary embodiment, first contact electrodes of each light emitting device chip 130 may be connected to the connection line 150 using a wire or other connection members, and second contact electrodes of each light emitting device chip 130 may be connected to the connection line 150 using a wire or other connection members.

Referring to FIG. 6B, a plurality of light emitting device chips 130 may be connected to a connection line 150 in series. According to the present exemplary embodiment, the light emitting device chips 130 and the connection line 150 may be connected in series by connecting the connection line 150 connected to an electrode pad 170 to a first contact electrode of an adjacent light emitting device chip 130 and by connecting a second contact electrode of the adjacent light emitting device chip 130 to a first contact electrode of an adjacent light emitting device chip 130 via a connection line 150 on the opposite side.

Although not shown in figures, different from the embodiments shown in FIGS. 6A and 6B, the light emitting device chip 130 may be arranged in a combination of serial and parallel connections. The connection method of the light emitting device chips 130 may be modified in various ways by taking into account a current applied thereto or an amount of light emitted therefrom. In addition, the connection line 150 is entirely connected to the light emitting device chips 130, but it should not be limited thereto or thereby. That is, a plurality of connection lines 150 to which a power is individually supplied may be separately provided. For example, in the exemplary embodiment of the present disclosure, all the light emitting device chips 130 provided in the first, second, third, and fourth flat portions R1, R2, R3, and R4 are directly or indirectly connected to each other. However, according to another embodiment, only the light emitting device chips 130 corresponding to each one of the flat portions R1, R2, R3, R4, . . . , and Rn, i.e., the same flat portion, may be directly or indirectly connected to each other, and the light emitting device chips 130 corresponding to different flat portions R1, R2, R3, R4, . . . , and Rn may be individually operated without being connected to each other.

In the exemplary embodiment of the present disclosure, as the substrate of the filament is formed not of a glass or ceramic material but of a metal material, the heat generated by the light emitting device chip may be effectively dispersed. Accordingly, due to the heat dissipation effect of the light emitting device chip, deterioration of the light emitting device chip may be prevented. In a conventional bulb-type light source, when a substrate used for the light emitting device filament is formed of the glass or ceramic material, it is necessary to fill a helium gas as a heat transfer medium in the globe for the heat dissipation. However, according to the exemplary embodiment of the present disclosure, the heat dissipation effect may be increased by using the metal substrate, and thus, there is no need to fill a heat dissipation gas, such as the helium gas, in the globe. Therefore, a manufacturing method of the bulb-type light source is simplified, and a manufacturing cost of the bulb-type light source is reduced. In addition, when the substrate is formed of the metal material, the light emitted from the light emitting device chip may be effectively scattered and/or reflected, and thus, the light emission efficiency may be improved.

As described above, as the bulb-type light source according to the exemplary embodiment of the present disclosure includes the light emitting device filament that is bent multiple times, the light emission area is significantly expanded, compared with the conventional bulb-type light source.

Even when a light emitting device filament is used to emit the light in a conventional bulb-type light source, the light emitting device filament of the conventional bulb-type light source is provided in a straight-line shape. In the case of the light emitting device filament provided in the straight-line shape, the light is emitted only in one direction that is perpendicular to the straight line. As a result, the light is hardly emitted in a direction parallel to the straight line, that is, the light is hardly emitted to both ends in a direction in which the light emitting device filament extends. Consequently, in the light emitting device filament of the straight-line shape, there are areas in which the amount of the light significantly decreases along a predetermined direction.

However, since the light emitting device filament according to the exemplary embodiment of the present disclosure includes the bendable portion, the light emitting device filament may be bent in various directions, and the light may be emitted in various directions rather than one direction. In addition, in the exemplary embodiment of the present disclosure, as the light emitting device filament is bendable, curved, or flexed in various directions or a plurality of bent light emitting device filaments is provided, the light may be uniformly emitted in all directions without reducing the amount of light in a specific direction. In particular, when the light emitting device filament according to the exemplary embodiment of the present disclosure is used, the amount of the light traveling upward along the extension direction of the central axis may be significantly increased.

Figure 7:
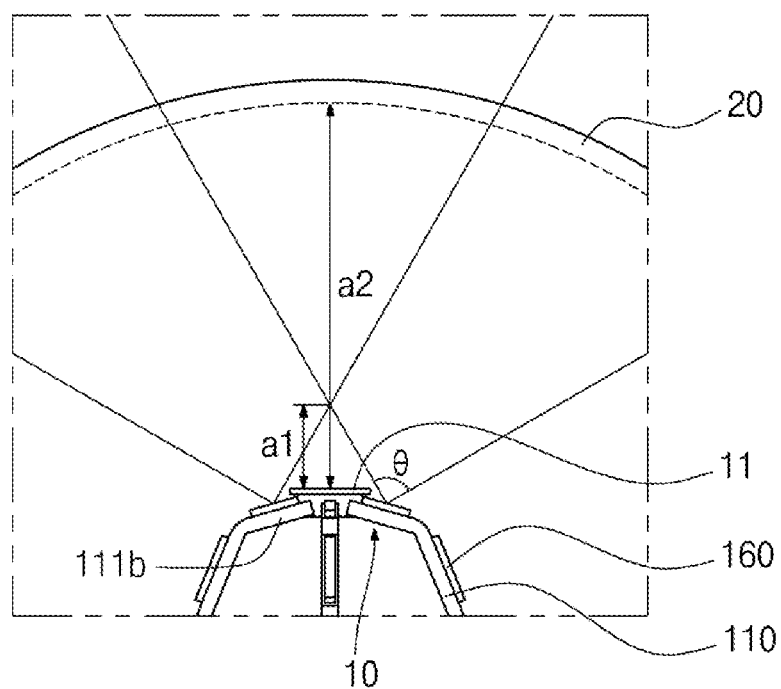
FIG. 7 is a side cross-sectional view showing a portion of a bulb-type light source employing a light emitting device filament according to an exemplary embodiment of the present disclosure.

FIG. 7 is a side cross-sectional view showing a portion of a bulb-type light source employing a light emitting device filament according to an exemplary embodiment of the present disclosure with a traveling direction of a light emitted from a light emitting device in the light emitting device filament.

Referring to FIG. 7, the bulb-type light source according to the exemplary embodiment includes the bendable portion, and thus, the light emitting device filament 10 may be bent in various directions. Particularly, since the second end 111*b* of the bendable portion is bent through the notch, the extension direction thereof may be close to the direction perpendicular to the direction in which the central axis passes. Accordingly, the emission angle of the light emitted from light emitting devices in the light emitting device filament 10 is also changed in accordance with the arrangement direction of the second end 111b of the bendable portion. For example, when the light emitting device disposed on the second end 111b emits a light having a predetermined orientation angle θ, the light emitted from the second end 111b of the light emitting device filament 10 travels to an area shown in FIG. 7, i.e., to an upper portion and an area slightly inclined from the upper portion (an area within an angle indicated by θ). Here, when the light emitting device filament 10 is provided in plural numbers, there exists an area in which traveling directions of the light emitted from the light emitting device filaments 10 overlap each other, and dark spots are not visible since a sufficient amount of light travels in the overlapping area. Particularly, according to the exemplary embodiment of the present disclosure, when lights emitted from adjacent light emitting device filaments 10 facing each other travel symmetrically with an orientation angle of θ, a distance a1 from the fixing plate 11 to the overlapping area of the lights emitted from the two filaments is smaller than a distance a2 from the fixing plate 11 to the globe 20, and thus, the dark spots in the upward direction of the bulb-type light source practically rarely occur.

This is explained in more detail as follows. In general, since the light emitting device filament is mounted on the substrate in a state where an individual light emitting device chip mounted on the light emitting device filament has a predetermined orientation angle (for example, from about 90 degrees to less than about 180 degrees, or from about 120 to about 150 degrees), the emission direction of the light may vary depending on the shape of the light emitting device filament. In the case where the light emitting device filament has the straight-line shape as the conventional light emitting device filament, the light emitted from the light emitting device chips is emitted only in a certain direction. As a result, the amount of the light is maximum in the direction perpendicular to the extension direction of the light emitting device filament, and the amount of the light is significantly reduced in the extension direction of the light emitting device filament and the opposite direction to the extension direction of the light emitting device filament.

Although the light emitting device filament according to the exemplary embodiment of the present disclosure includes the light emitting device chip having the predetermined orientation angle, the traveling direction of the light from the individual light emitting device chip in the light emitting device filament is variously expanded since the light emitting device filament is bent at various angles.

In other words, the light emitting device filament of the present disclosure has the bendable or curved shape at multiple positions to be substantially perpendicular or to be inclined to the extension direction of the central axis when the light emitting device filament extends along the central axis. The light emitting device chips are arranged along the bendable shape and emit the light entirely from the extension direction of the central axis to the opposite direction to the extension direction with respect to the central axis. Accordingly, the light emitting device filament of the present disclosure may provide the substantially uniform light from front to back along the extension direction of the central axis and over substantially 360 degrees along the direction perpendicular to the extension direction of the central axis.

Consequently, as the light emitting device filaments are bendable or curved, the individual light emitting device chips are directed in various directions and finally emit the light while covering a large area. In this case, the degree of bending of the substrate at the bendable portion may be adjusted according to the orientation angle of the individual light emitting device chip.

In addition, since the light emitting device filament according to the exemplary embodiment of the present disclosure may be formed of a relatively rigid material to have the flat shape at the flat portion other than the bent portion, it is easy to control the curvature in the overall shape. When the substrate is formed of a flexible material, it is difficult to control the angle at which the light emitting device filament is bent, and thus, it is not easy to form the light emitting device filament into a desired shape. In addition, when the substrate is formed of the flexible material, the substrate is easily deformed due to external impacts. In order to easily control the curvature while using the rigid substrate, the thickness of the substrate may be reduced. However, when the thickness of the substrate is reduced by more than a predetermined degree, the amount of heat that can dissipate through the substrate is also reduced, thereby decreasing the heat dissipation effect.

However, as the light emitting device filament according to the exemplary embodiment of the present disclosure may be bent at an appropriate degree by the bendable portion, the overall shape may be controlled. In addition, since the light emitting device filament is not flexible, the shape of the light emitting device filament is also less likely to be deformed by the external impacts. Further, the substrate is easily bendable while having the thickness with a predetermined degree or more due to the bendable portion, and the shape of the light emitting device filament may be easily changed and the heat dissipation effect may be improved According to the exemplary embodiment of the present disclosure, the bulb-type light source having the above-described shape may employ a structure for preventing disconnection at the bendable portion.

Figure 8A:
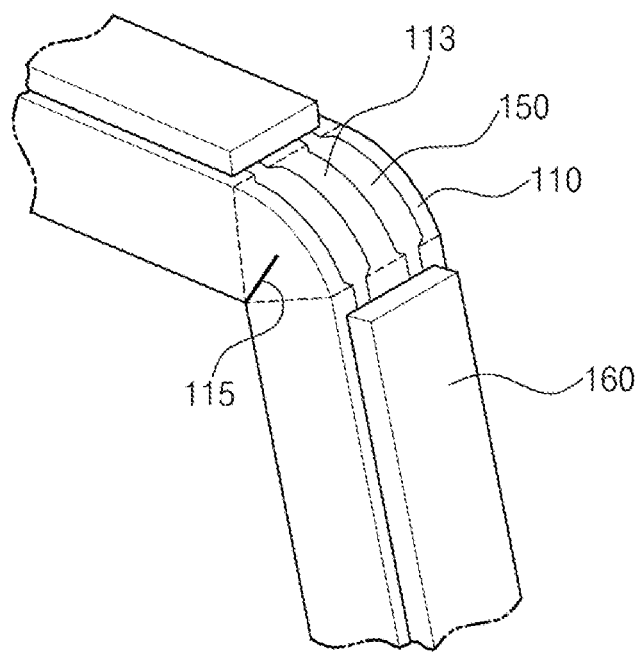
FIG. 8A is a perspective view showing a bendable portion and two flat portions adjacent to a bendable portion of a bulb-type light source according to an exemplary embodiment of the present disclosure.
Figure 8B:
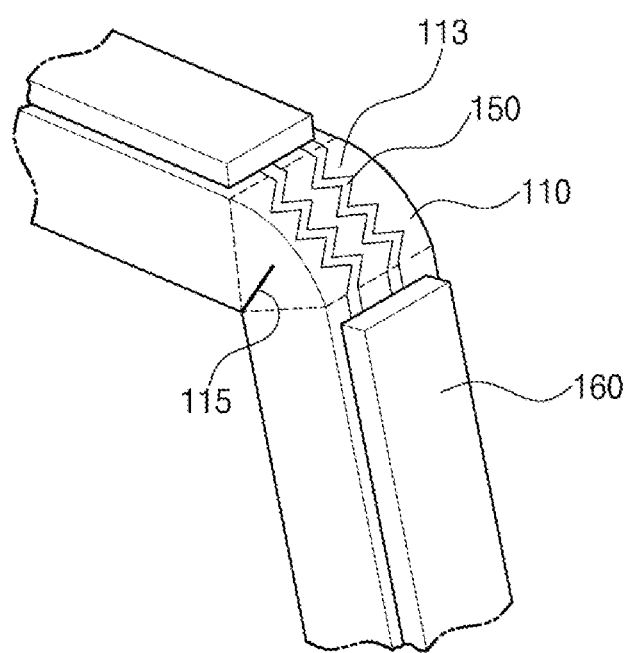
FIG. 8B is a perspective view showing a bendable portion having a different shape from the bendable portion of FIG. 8A and two flat portions adjacent to the bendable portion of a bulb-type light source according to an exemplary embodiment of the present disclosure.

FIGS. 8A and 8B are perspective views showing a bendable portion 113 and two flat portions adjacent to the bendable portion 113 of a bulb-type light source according to an exemplary embodiment of the present disclosure. FIGS. 8A and 8B show that the substrate 110 is bent at the bendable portion 113, and some components are omitted. Hereinafter, different features from the above-mentioned features will be mainly described in order to avoid redundancy.

Referring to FIGS. 8A and 8B, the substrate 110 includes the bendable portion 113 in which a notch 115 is formed and the flat portions disposed at both sides of the bendable portion 113.

A light emitting device chip 130 (not shown), a connection line 150 connecting each light emitting device chip (not shown) to adjacent light emitting device chip, and a fluorescent substance layer 160 covering the light emitting device chip 130 are formed at each flat portion of the substrate 110. In the present exemplary embodiment, the light emitting device chip 130 and the fluorescent substance layer 160 are disposed only on each flat portion and not disposed on the bendable portion 113.

The notch 115 is formed in a lower surface of the substrate 110, and the substrate 110 is bent downward with respect to the notch 115 of the bendable portion 113. As the substrate 110 is bent downward with respect to the bendable portion 113, an upper surface of the substrate 110 corresponding to the bendable portion 113 is bent, and a tensile stress is applied to components disposed on the upper surface of the substrate 110. Accordingly, lines disposed on the bendable portion 113 may be disconnected by the tensile stress.

In the exemplary embodiment of the present disclosure, in order to reduce the disconnection of the connection line 150 due to the tensile stress of the bendable portion 113, a width, or a shape of the connection line 150 may be set differently. For example, as shown in FIG. 8A, when the width of the lines in the bendable portion 113 increases, even though a defect such as a crack occurs in some portions of the lines, the disconnection may be prevented by connecting the lines by remaining portions of the lines.

As another example, as shown in FIG. 8B, the connection line 150 may have a zigzag shape in the bendable portion 113. When the connection line 150 is disposed to be inclined to a direction to which the tensile stress is applied in the zigzag shape, the applied stress is reduced. Therefore, the disconnection of the connection line 150 in the bendable portion 113 may be prevented.

According to the exemplary embodiment of the present disclosure, the bendable portion 113 may be modified in various ways to facilitate the bending of the light emitting device filament 10. FIGS. 9A to 9E are cross-sectional views showing various types of bendable portions 113. For the convenience of explanation, FIGS. 9A to 9E show only a substrate 110 and a notch 115, and others are omitted.

Figure 9A:
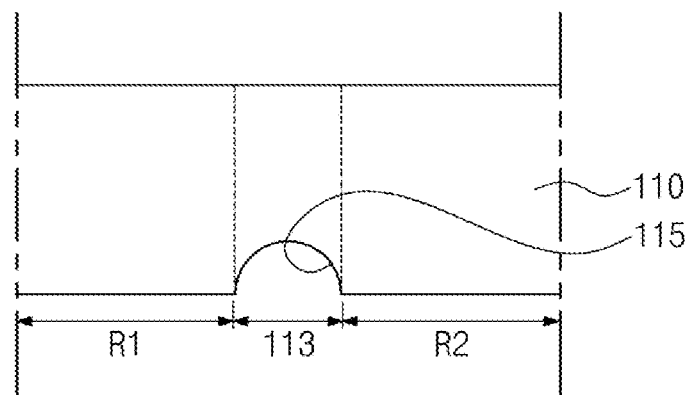
FIG. 9A is a cross-sectional view showing a first type of bendable portion.
Figure 9B:
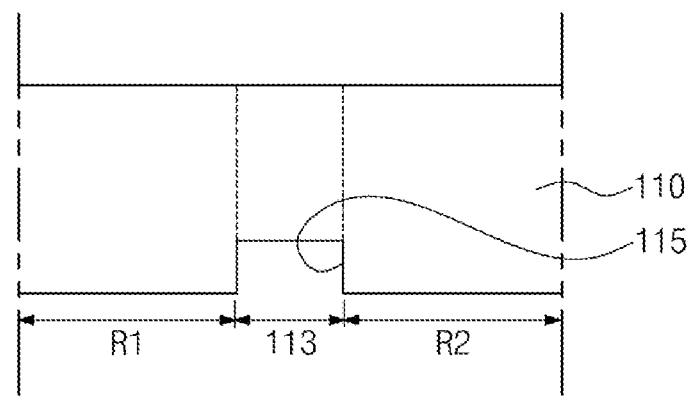
FIG. 9B is a cross-sectional view showing a second type of bendable portion.

Referring to FIGS. 9A to 9E, the bendable portion 113 may have various cross-sectional shapes. For example, the bendable portion 113 may have a semi-circular shape as shown in FIG. 9A or may have a rectangular shape as shown in FIG. 9B.

Figure 9C:
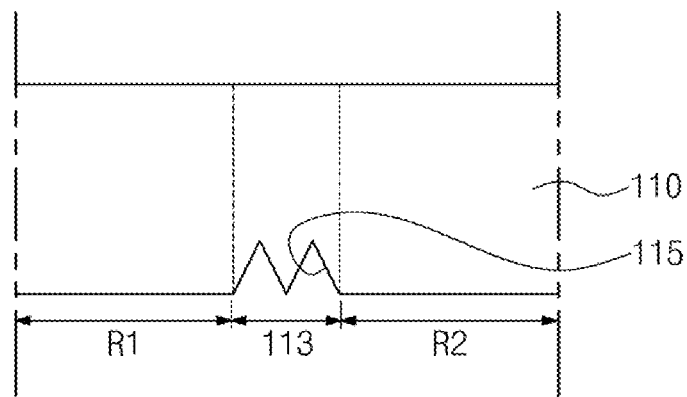
FIG. 9C is a cross-sectional view showing a third type of bendable portion.

In addition, one notch 115 is provided in the bendable portion, however, as shown in FIG. 9C, two or more notches 115 may be continuously arranged in the bendable portion.

Figure 9D:
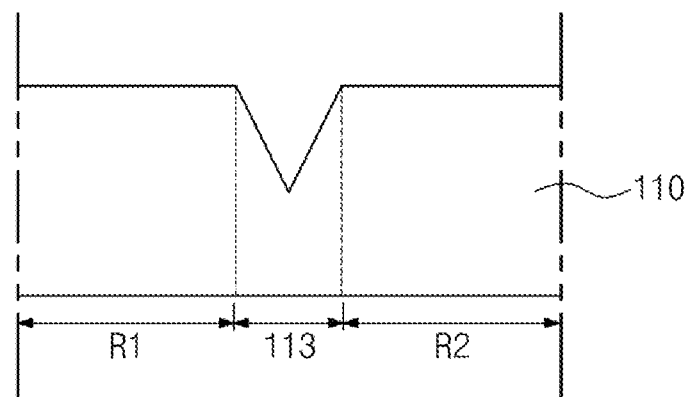
FIG. 9D is a cross-sectional view showing a fourth type of bendable portion.
Figure 9E:
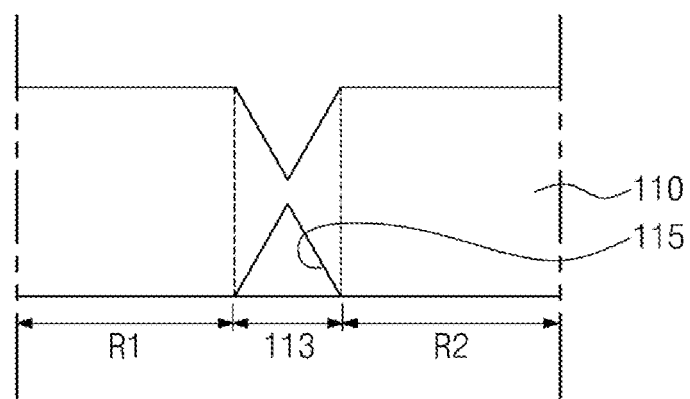
FIG. 9E is a cross-sectional views showing a fifth type of bendable portion.

Further, the notch 115 may be disposed on an upper surface as well as a lower surface. That is, since the surface provided with the notch 115 may be folded concavely or convexly in any direction, the notch 115 may be formed in a direction that is easy to bend. For example, the notch 115 may be disposed on the upper surface as shown in FIG. 9D, or the notch 115 may be formed on both the upper surface and the lower surface as shown in FIG. 9E.

As described above, the notch 115 may be provided in various shapes, various numbers, and various positions depending on the shape of the desired light emitting device filament.

Figure 10A:
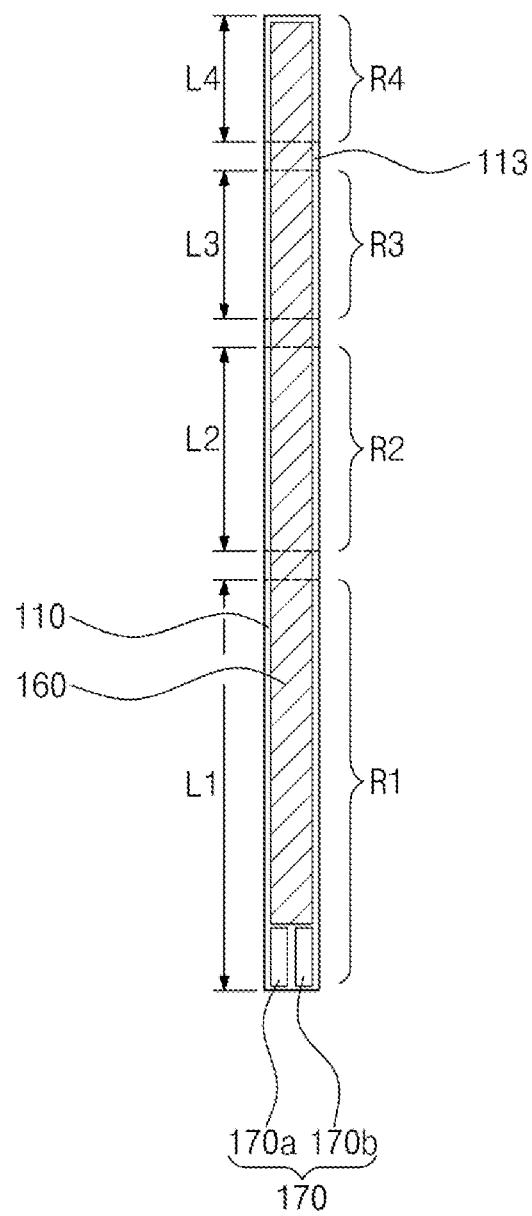
FIG. 10A is a plan view showing a light emitting device filament according to another exemplary embodiment of the present disclosure.
Figure 10B:
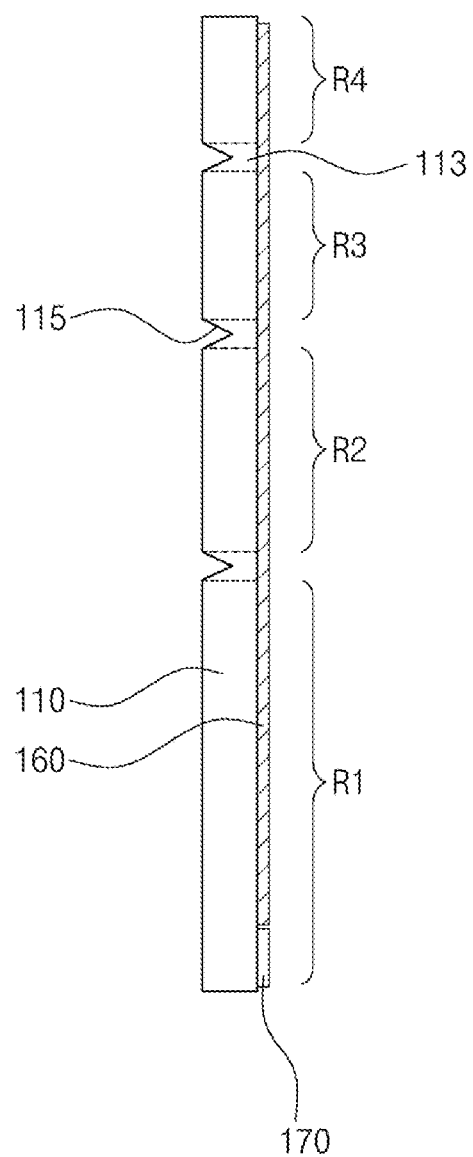
FIG. 10B is a side view showing the light emitting device filament of FIG. 10A.
Figure 10C:
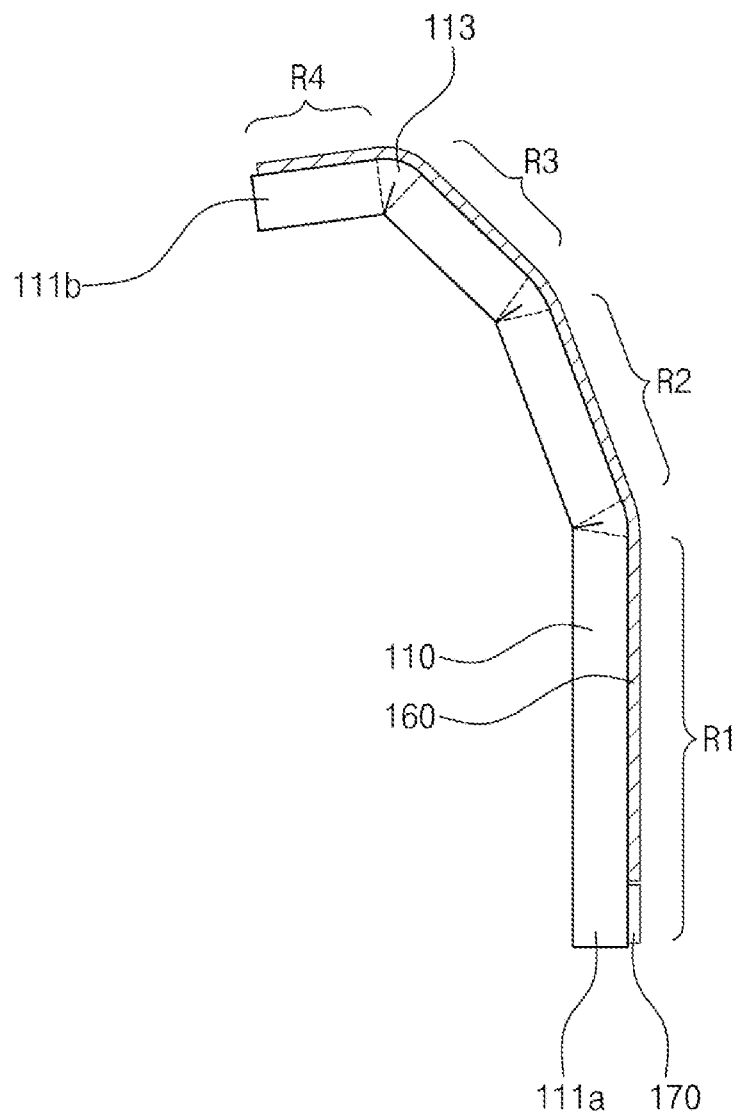
FIG. 10C is a side view showing the light emitting device filament of FIG. 10B in a bent shape.

In the exemplary embodiment of the present disclosure, the fluorescent substance layer may be provided in various shapes. FIGS. 10A to 10C are views showing a light emitting device filament according to another exemplary embodiment of the present disclosure. FIG. 10A is a plan view showing the light emitting device filament, and FIGS. 10B and 10C are side views showing the light emitting device filament.

Referring to FIGS. 10A to 10C, in a light emitting device chip 130 according to another exemplary embodiment of the present disclosure, a fluorescent substance layer 160 is disposed on a bendable portion 113 and flat portions respectively disposed at both sides of the bendable portion 113. In other words, the fluorescent substance layer 160 extends from the flat portion and is disposed on the bend portion 113.

As a substrate 110 is bent at the bendable portion 113, the fluorescent substance layer 160 disposed on the substrate 110 also has a bent shape at the bendable portion 113. In this case, an upper surface of the substrate 110 is bent convexly, and the fluorescent substance layer 160 is bent in a convex shape along the upper surface of the substrate 110. The fluorescent substance layer 160 is bent and subjected to a tensile stress at both sides thereof. Accordingly, the fluorescent substance layer 160 has a shape that stretches to the both sides at the bendable portion 113 and is thinner than the fluorescent substance layer 160 of each flat portion. Therefore, the fluorescent substance layer 160 has different thicknesses at the flat portion and the bendable portion 113. In addition, although not shown in figures, an insulating adhesive, a connection line 150, and a photo solder paste may be further provided between the substrate 110 and the fluorescent substance layer 160. The insulating adhesive, the connection line 150, and the photo solder paste have the bent shape at the bendable portion 113 and have different thicknesses at the flat portion and the bendable portion 113.

In the exemplary embodiment of the present disclosure, the fluorescent substance layer 160 may include a material having elasticity, and thus, cutting or excessive bending of the fluorescent substance layer 160 may be reduced when the substrate 110 is bent.

Figure 11A:
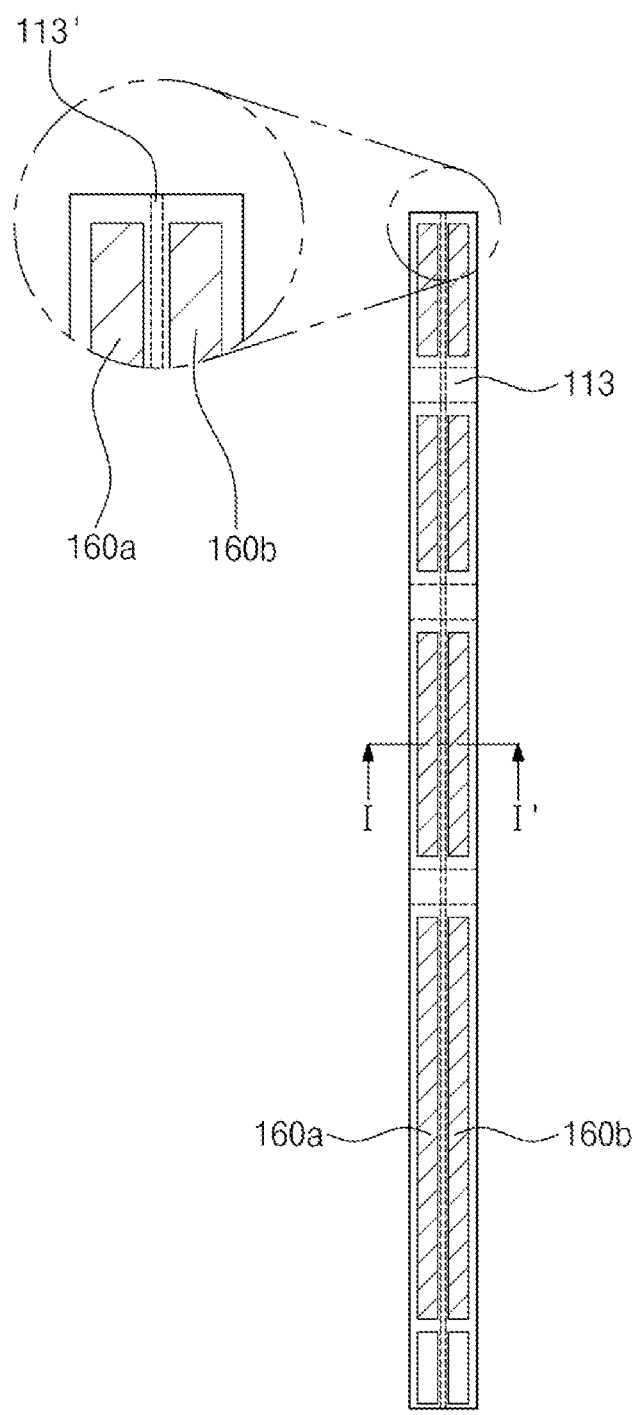
FIG. 11A is a plan view showing a light emitting device filament according to another exemplary embodiment of the present disclosure.

According to the exemplary embodiment of the present disclosure, the bendable portion may be formed along a width direction as well as a longitudinal direction of the light emitting device filament. FIG. 11A is a plan view showing a light emitting device filament according to another exemplary embodiment of the present disclosure, and FIG. 11B is a cross-sectional view taken along a line I-I' of FIG. 11A.

Figure 11B:
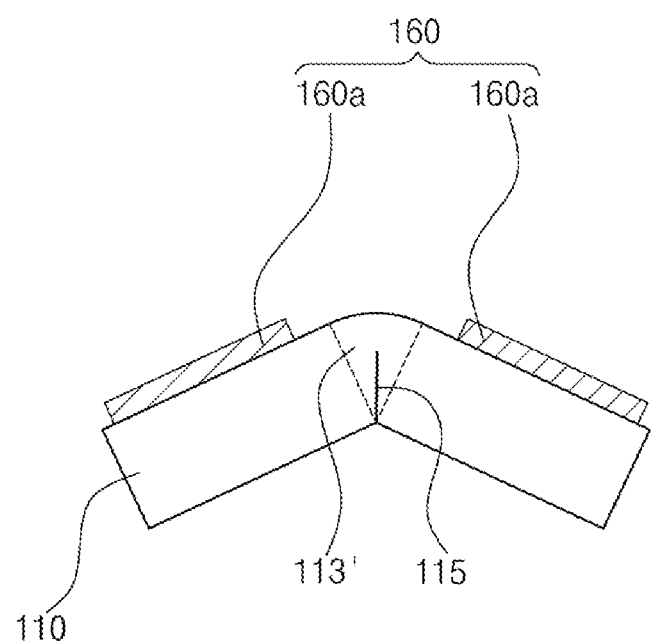
FIG. 11B is a cross-sectional view taken along a line I-I' of FIG. 11A.

Referring to FIGS. 11A and 11B, the bendable portion may be bent in a width direction of a light emitting device filament, or alternatively in a longitudinal direction of the light emitting device filament. That is, the bendable portion may include a bendable portion 113 perpendicular to an extension direction of a substrate 110 and a bendable portion 113' parallel to the extension direction of the substrate 110. Accordingly, the substrate 110 of the light emitting device filament may be bent along both the longitudinal direction and the width direction of the substrate 110. As the bendable portion is provided in various forms, a degree of freedom in the shape of the bendable portion increases.

In the present exemplary embodiment, a light emitting device chip 130 and a fluorescent substance layer may not be formed in areas in which the bendable portions 113 and 113' are formed. In this case, the fluorescent substance layer may be divided into a first fluorescent substance layer 160a and a second fluorescent substance layer 160b spaced apart from each other with the bendable portion 113 disposed therebetween.

When plural fluorescent substance layers are provided and the fluorescent substance layers are spaced apart from each other, the fluorescent substance layers may convert a specific light into lights having the same color as each other, or may convert the specific light into lights having different colors from each other.

Figure 12A:
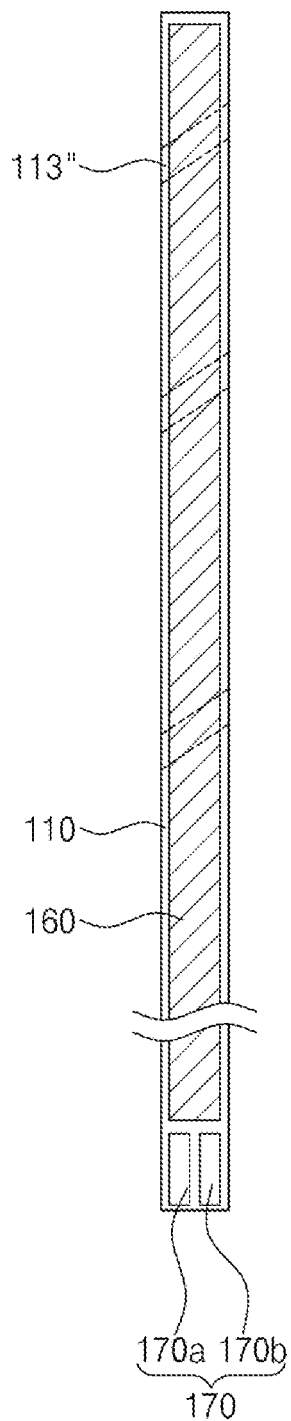
FIG. 12A is a plan view showing a light emitting device filament according to an exemplary embodiment of the present disclosure.
Figure 12B:
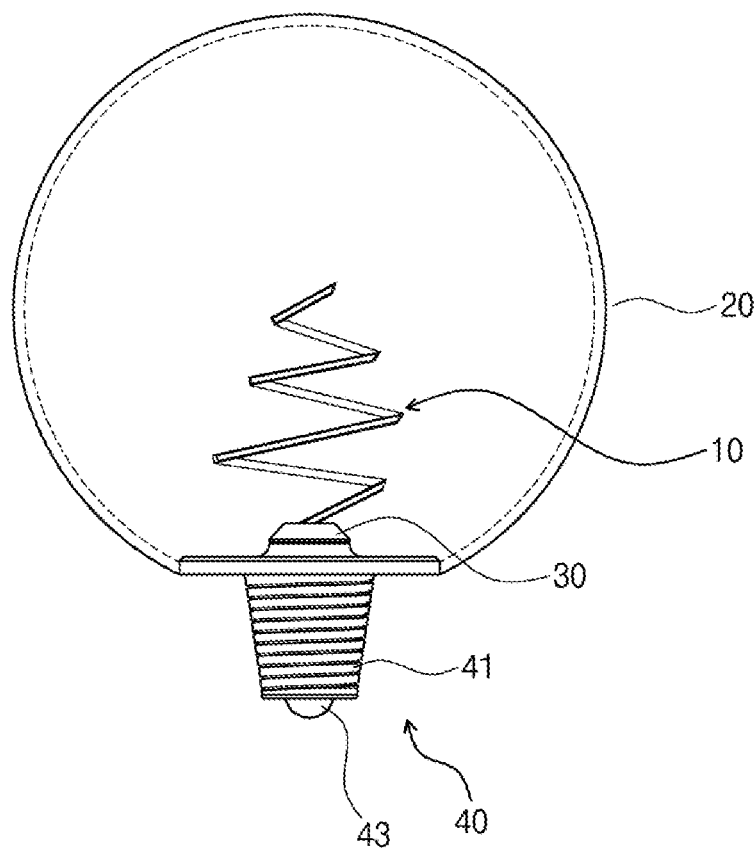
FIG. 12B is a view showing a bulb-type light source manufactured using the light emitting device filament of FIG. 12A.

FIG. 12A is a plan view showing a light emitting device filament according to an exemplary embodiment of the present disclosure, and FIG. 12B is a view showing a bulb-type light source manufactured using the light emitting device filament of FIG. 12A.

Referring to FIGS. 12A and 12B, a bendable portion 113" may be disposed to be inclined with respect to a longitudinal direction or a width direction of a light emitting device filament 10 rather than the longitudinal direction or the width direction of the light emitting device filament 10. When the bendable portion 113" is inclined with respect to the longitudinal direction or the width direction, the light emitting device filament is bent in an oblique direction. Accordingly, a spiral-shaped filament may be implemented as shown in FIG. 12B. The spiral-shaped filament may emit the light in various directions as well as a certain direction, and thus, uniformity of the light may be enhanced.

Figure 13A:
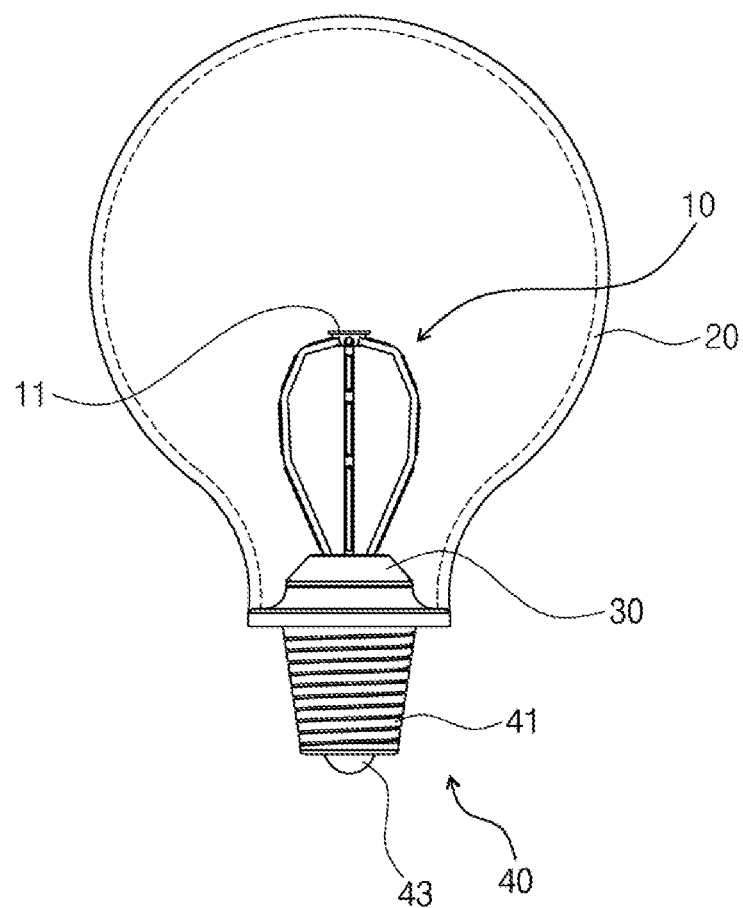
FIG. 13A is a cross-sectional view showing a first type of globe.
Figure 13B:
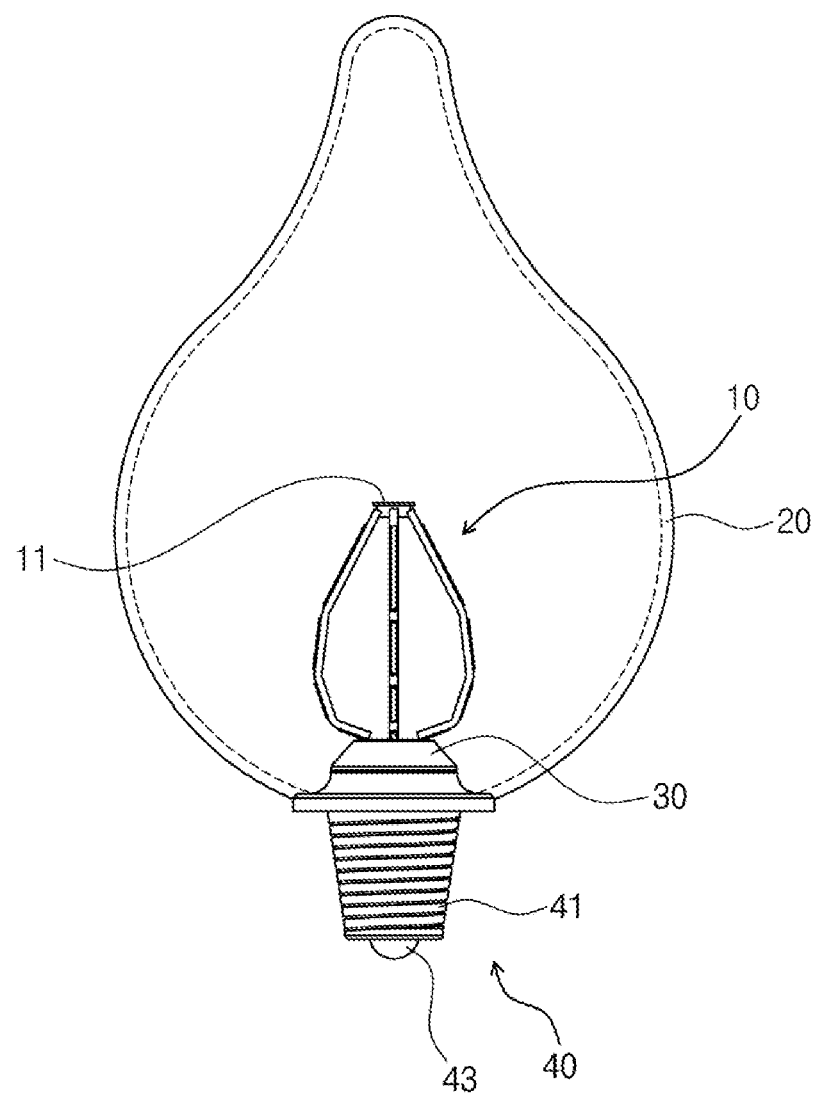
FIG. 13B is a cross-sectional view showing a second type of globe.
Figure 13C:
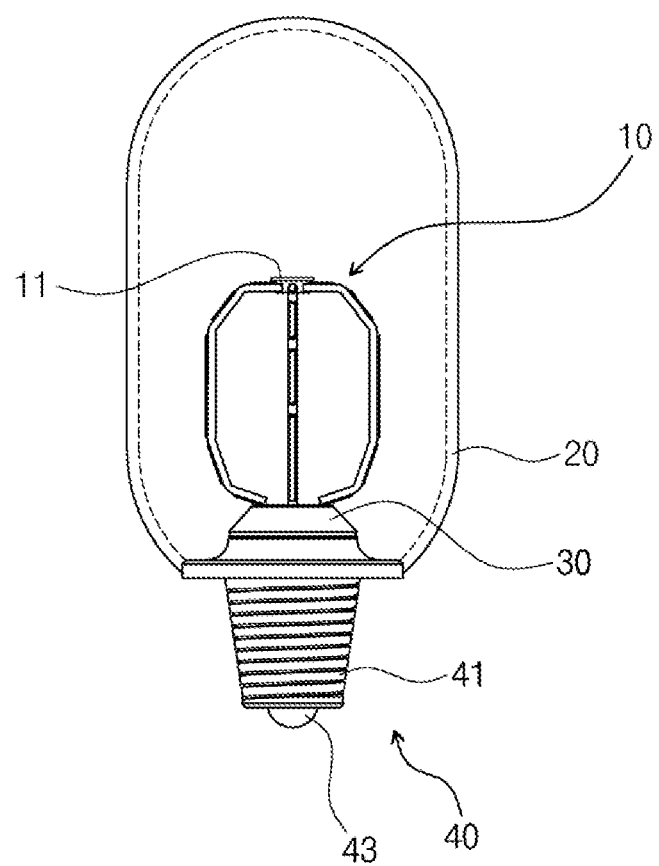
FIG. 13C is a cross-sectional view showing a third type of globe.

According to an exemplary embodiment of the present disclosure, a shape of the globe may be changed in various forms. FIGS. 13A to 13C are cross-sectional views showing various types of globes 20.

Referring to FIGS. 13A to 13C, the globe 20 may have a radius that increases or decreases along a central axis as a distance from a socket 40 increases. Alternatively, the radius may be maintained and then may increase or decrease. The shape of the globe 20 may vary according to various designs. The shape of the light emitting device filament 10 may vary depending on the shape of the globe 20. When the radius from the central axis of the globe 20 is large, the degree of bending of the light emitting device filament 10 may also increase, and when the radius from the central axis of the globe 20 is small, the degree of bending of the light emitting device filament 10 may also decrease.

Figure 14:
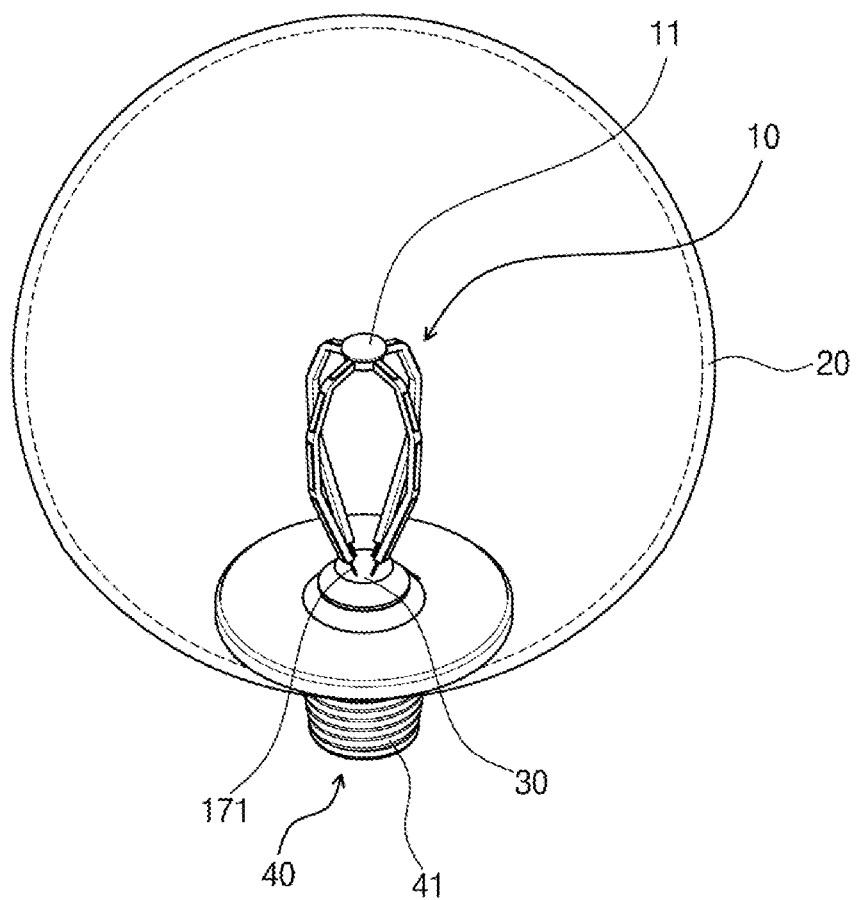
FIG. 14 is a view showing a bulb-type light source according to an exemplary embodiment of the present disclosure.

According to an exemplary embodiment of the present disclosure, the connection relation between the light emitting device filament and the power board may be provided differently from the above-described embodiment. FIG. 14 is a view showing a bulb-type light source according to an exemplary embodiment of the present disclosure, and instead of forming an electrode pad at a first end 111a of a light emitting device filament, a wire electrode 171 is provided. In the exemplary embodiment of the present disclosure, the wire electrode 171 may be connected to a line unit in a socket 40. As described above, the light emitting device filament may be supplied with power from the line unit in various ways, and a power supply method may be changed in various ways as necessary.

According to the exemplary embodiment of the present disclosure, as the filament having the straight-line shape is easily bent using the notch, the light emitting device filament having various shapes may be manufactured. In the exemplary embodiment of the present disclosure, when several filaments having the straight-line shape are provided, the several filaments having the straight-line shape may be bent simultaneously by fixing the second end at the angle "6" and then pushing the first ends in the direction toward the second end simultaneously. For example, after inserting several filaments, which are not yet bent and have the straight-line shape, into the globe, the filament having the straight-line shape may be bent into a specific shape by pushing one end of the filament having the straight-line shape inwardly. In this case, since the light emitting device filament is bent in the globe, it is possible to manufacture the light emitting device filament that is wider than the opening of the globe.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

According to the exemplary embodiment of the present disclosure, the bulb-type light source with the shape similar to that of the conventional bulb but with the high light uniformity in all directions is provided.

The invention claimed is:
1. A lighting device comprising:
a globe configured to transmit light;
a light emitter disposed in the globe and including a first end and a second end and having a plurality of non-flat regions, the light emitter comprising:
light emitting sources, each of the light emitting sources including a first contact electrode and a second contact electrode;
a first electrode pad electrically connected to first contact electrodes of the light emitting sources;
a second electrode pad electrically connected to second contact electrodes of the light emitting sources;
a wavelength converter covering one or more light emitting sources and converting a wavelength of light emitted from the light emitting sources; and
a connection line disposed on an insulating material and configured to electrically connected to at least one of the first electrode pad or the second electrode pad that are electrically connected to the light emitting sources;
a power board electrically connected to at least one end of the light emitter; and
a fixer connected to the light emitter,
wherein two of the light emitting sources are configured to emit light with orientation angles defining corresponding light emission areas that overlap with each other in an overlapping region;
wherein a distance from the fixer to the overlapping region is smaller than a distance from the fixer to the globe.

2. The lighting device of claim 1, wherein the two of the light emitting sources are disposed apart from the fixer by different distances from each other.

3. The lighting device of claim 1, further comprising:
a socket engaged with the globe,
wherein the power board is disposed in the socket.

4. The lighting device of claim 1, wherein the first end of the light emitter is connected to the power board and the second end of the light emitter is spaced apart from the power board.

5. The lighting device of claim 1, wherein the first end of the light emitter and the second end of the light emitter are connected to the power board.

6. The lighting device of claim 1, wherein the fixer is connected to at least one of the first end and the second end of the light emitter.

7. The lighting device of claim 1, wherein a first distance between a central axis and the first end of the light emitter is smaller than a second distance between the central axis and a region of the light emitter that is between the first end and the second end.

8. A lighting device comprising:
a light emitter including a first end and a second end and having a plurality of non-flat regions, the light emitter comprising:
light emitting sources configured to emit light, each of the light emitting sources including a first contact electrode and a second contact electrode;
a first electrode pad electrically connected to first contact electrodes of the light emitting sources;
a second electrode pad electrically connected to second contact electrodes of the light emitting sources;
a wavelength converter covering one or more light emitting sources and converting a wavelength of light emitted from one or more light emitting sources; and
a connection line disposed on an insulating material and configured to electrically connected to at least one of the first electrode pad or the second electrode pad that are electrically connected to the light emitting sources;

a power board electrically connected to at least one end of the light emitter; and a fixer connected to the light emitter and located at a position through which a central axis passes, wherein a first distance between the central axis and the first end of the light emitter is smaller than a second distance between the central axis and a region of the light emitter that is between the first end and the second end.

9. The lighting device of claim 8, further comprising a globe located to cover the light emitter and configured to transmit the light emitting from the light emitter.

10. The lighting device of claim 9, wherein two of the light emitting sources are configured to emit light with orientation angles defining corresponding light emission areas that overlap with each other in an overlapping region, and wherein a distance from the fixer to the overlapping region is smaller than a distance from the fixer to the globe.

11. The lighting device of claim 8, wherein the first distance is greater than a third distance between the central axis and the second end of the light emitter.

12. The lighting device of claim 8, wherein the light emitting sources are disposed between the first end and the second end and at least two of the light emitting sources are disposed apart from the fixer by different distances from each other.

13. The lighting device of claim 8,
a socket engaged with the light emitter,
wherein the power board is disposed in the socket.

14. The lighting device of claim 8, wherein two of the plurality of non-flat regions are disposed on different sides of the central axis.

15. A lighting device comprising:
a light emitter including a first end and a second end and having a plurality of non-flat regions, the light emitter comprising:
light emitting sources and configured to emit light, each of the light emitting sources including a first contact electrode and a second contact electrode;
a first electrode pad electrically connected to first contact electrodes of the light emitting sources;
a second electrode pad electrically connected to second contact electrodes of the light emitting sources;
a wavelength converter covering one or more light emitting sources and converting a wavelength of light emitted from one or more light emitting sources; and
a connection line disposed on an insulating material and configured to electrically connected to at least one of the first electrode pad or the second electrode pad that are electrically connected to the light emitting sources;

a power board electrically connected to at least one of the first end and the second end of the light emitter; and a fixer connected to the light emitter and configured to allow a central axis to pass through the fixer, wherein a first distance between the central axis and the first end of the light emitter is different from a second distance between the central axis and the second end of the light emitter.

16. The lighting device of claim 15, further comprising a globe located to surround the light emitter and including light transmitting material to transmit the light emitted from the light emitting sources.

17. The lighting device of claim 16, wherein two of the light emitting sources are configured to emit light with orientation angles defining corresponding light emission areas that overlap with each other in an overlapping region, and wherein a distance from the fixer to the overlapping region is smaller than a distance from the fixer to the globe.

18. The lighting device of claim 15, wherein the first distance is smaller than the second distance.

19. The lighting device of claim 15, wherein the first distance and the second distance are smaller than a third distance between the central axis and the first end of the light emitter.

20. The lighting device of claim 15, wherein two of the plurality of non-flat regions are disposed on different sides of the central axis.

* * * * *